United States Patent [19]

Abe et al.

[11] Patent Number: 5,418,719
[45] Date of Patent: May 23, 1995

[54] TROUBLE CHECKING APPARATUS

[75] Inventors: Takahiro Abe, Yokohama; Kazuyoshi Fukawa, Tokyo; Masaaki Kamimura, Kawasaki, all of Japan

[73] Assignee: Nissan Motor Co., Ltd., Yokohama, Japan

[21] Appl. No.: 12,831

[22] Filed: Feb. 3, 1993

[30] Foreign Application Priority Data

Feb. 4, 1992 [JP] Japan .................................. 4-047989

[51] Int. Cl.⁶ ............................................. G01M 17/00
[52] U.S. Cl. ............................ 364/424.03; 364/551.01; 340/438
[58] Field of Search ................. 364/424.02, 424.03, 364/431.01, 550, 551.01; 340/438, 439; 73/117.2, 117.3

[56] References Cited

U.S. PATENT DOCUMENTS

| | | | |
|---|---|---|---|
| 4,476,531 | 10/1984 | Marino et al. | 364/431.01 |
| 4,812,768 | 3/1989 | Quinn | 364/551.01 |
| 5,034,893 | 7/1991 | Fisher | 364/431.01 |
| 5,272,769 | 12/1993 | Strnatka et al. | 364/424.04 |

FOREIGN PATENT DOCUMENTS 2-181298  7/1990  Japan .

*Primary Examiner*—Gary Chin
*Attorney, Agent, or Firm*—Lowe, Price, LeBlanc & Becker

[57] ABSTRACT

A trouble checking apparatus for checking a trouble in a circuit or system. Data related to operating conditions of the circuit are inputted. A defective condition is checked for each of different regions of the circuit to provide a check result based upon the inputted data. The region is displayed in a graphic manner. The manners in which the circuit is presented at different regions of the circuit are controlled based upon the check results made for the respective regions.

8 Claims, 43 Drawing Sheets

FIG.4

FOR PART A
- TROUBLE MODE a_PART A : GROUND FAULT BETWEEN BATTERY AND PART A
- TROUBLE MODE b_PART A : DISCONNECTION BETWEEN BATTERY AND PART A
- TROUBLE MODE c_PART A : SHORT IN PART A
- TROUBLE MODE d_PART A : DISCONNECTION IN PART A
- TROUBLE MODE e_PART A : GROUND FAULT BETWEEN C/U AND PART A
- TROUBLE MODE f_PART A : DISCONNENCTION BETWEEN C/U AND PART A

FOR PART B
- TROUBLE MODE a_PART B : GROUND FAULT BETWEEN BATTERY AND PART B
- TROUBLE MODE b_PART B : DISCONNECTION BETWEEN BATTERY AND PART B
- TROUBLE MODE c_PART B : SHORT IN PART B
- TROUBLE MODE d_PART B : DISCONNECTION IN PART B
- TROUBLE MODE e_PART B : GROUND FAULT BETWEEN PART B AND C/U
- TROUBLE MODE f_PART B : DISCONNENCTION BETWEEN PART B AND C/U

FOR PART D
- TROUBLE MODE a_PART D : GROUND FAULT BETWEEN C/U AND PART D
- TROUBLE MODE b_PART D : DISCONNECTION BETWEEN C/U AND PART D
- TROUBLE MODE c_PART D : SHORT IN PART D
- TROUBLE MODE d_PART D : DISCONNECTION IN PART D
- TROUBLE MODE e_PART D : GROUND FAULT BETWEEN PART D AND GND

FIG.5

| TROUBLE MODE LEVEL | TROUBLE ? | PRESENTED COLOR |
|---|---|---|
| -1.0 | NO TROUBLE | BLUE |
| 0.0 | POSSIBLE | YELLOW |
| 0.5 | MORE POSSIBLE | ORANGE |
| 1.0 | TROUBLE | RED |

FIG.6

| TROUBLE MODE | LEVEL |
|---|---|
| TROUBLE MODE a_PART A: GROUND FAULT BETWEEN BATTERY AND PART A | 0 |
| TROUBLE MODE b_PART A: DISCONNECTION BETWEEN BATTERY AND PART A | 0 |
| TROUBLE MODE c_PART A: SHORT IN PART A | 0 |
| TROUBLE MODE d_PART A: DISCONNECTION IN PART A | 0 |
| TROUBLE MODE e_PART A: GROUND FAULT BETWEEN PART A AND C/U | 0 |
| TROUBLE MODE f_PART A: DISCONNECTION BETWEEN PART A AND C/U | 0 |
| TROUBLE MODE a_PART B: GROUND FAULT BETWEEN BATTERY AND PART B | 0 |
| TROUBLE MODE b_PART B: DISCONNECTION BETWEEN BATTERY AND PART B | 0 |
| TROUBLE MODE c_PART B: SHORT IN PART B | 0 |
| TROUBLE MODE d_PART B: DISCONNECTION IN PART B | 0 |
| TROUBLE MODE e_PART B: GROUND FAULT BETWEEN PART B AND C/U | 0 |
| TROUBLE MODE f_PART B: DISCONNECTION BETWEEN PART B AND C/U | 0 |
| TROUBLE MODE a_PART D: GROUND FAULT BETWEEN C/U AND PART D | 0 |
| TROUBLE MODE b_PART D: DISCONNECTION BETWEEN C/U AND PART D | 0 |
| TROUBLE MODE c_PART D: SHORT IN PART D | 0 |
| TROUBLE MODE d_PART D: DISCONNECTION IN PART D | 0 |
| TROUBLE MODE e_PART D: DISCONNECTION BETWEEN GND AND PART D | 0 |

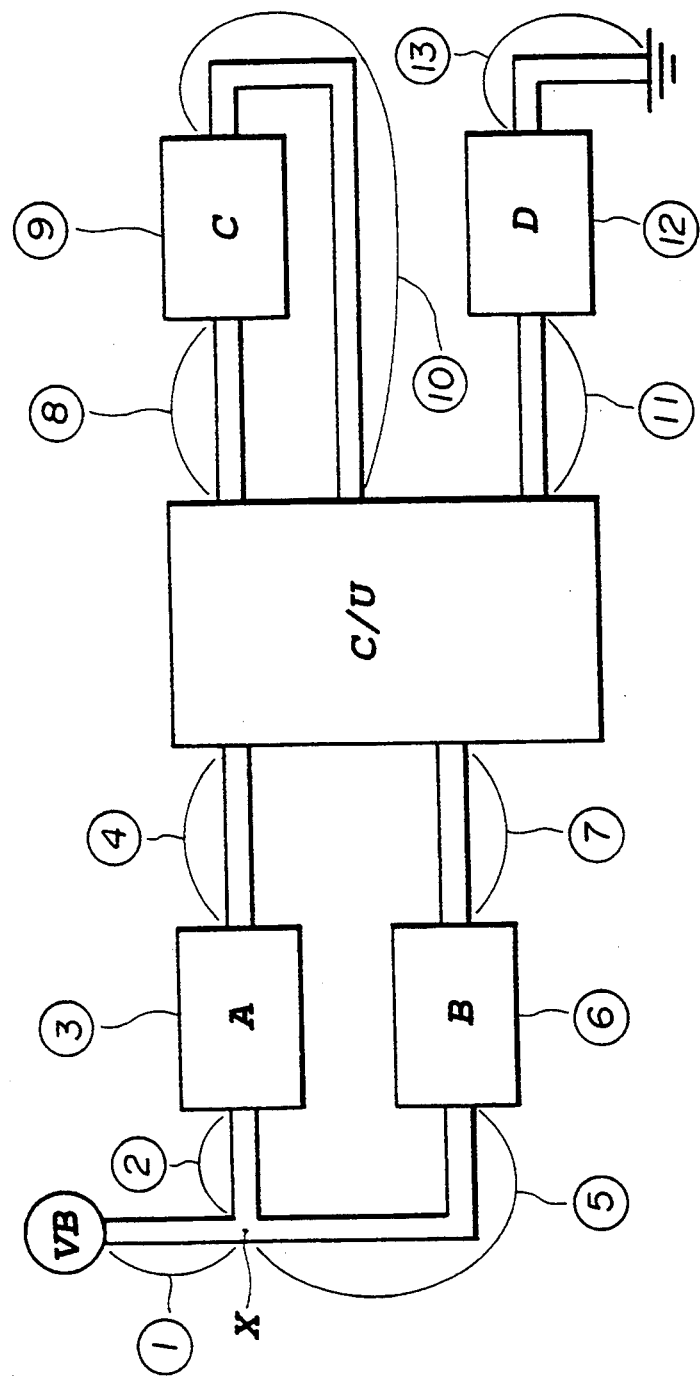

FIG.8

REGION NUMBER (1)
    TROUBLE MODE a_PART A: GROUND FAULT BETWEEN BATTERY AND PART A
    TROUBLE MODE b_PART A: DISCONNECTION BETWEEN BATTERY AND PART A
    TROUBLE MODE a_PART B: GROUND FAULT BETWEEN BATTERY AND PART B
    TROUBLE MODE b_PART B: DISCONNECTION BETWEEN BATTERY AND PART B

REGION NUMBER (2)
    TROUBLE MODE a_PART A: GROUND FAULT BETWEEN BATTERY AND PART A
    TROUBLE MODE b_PART A: DISCONNECTION BETWEEN BATTERY AND PART A

REGION NUMBER (3)
    TROUBLE MODE c_PART A: SHORT IN PART A
    TROUBLE MODE d_PART A: DISCONNECTION IN PART A

REGION NUMBER (4)
    TROUBLE MODE e_PART A: GROUND FAULT BETWEEN PART A AND C/U
    TROUBLE MODE f_PART A: DISCONNECTION BETWEEN PART A AND C/U

REGION NUMBER (5)
    TROUBLE MODE a_PART B: GROUND FAULT BETWEEN BATTERY AND PART B
    TROUBLE MODE b_PART B: DISCONNECTION BETWEEN BATTERY AND PART B

REGION NUMBER (6)
    TROUBLE MODE c_PART B: SHORT IN PART B
    TROUBLE MODE d_PART B: DISCONNECTION IN PART B

REGION NUMBER (7)
    TROUBLE MODE e_PART B: GROUND FAULT BETWEEN PART B AND C/U
    TROUBLE MODE f_PART B: DISCONNECTION BETWEEN PART B AND C/U

REGION NUMBER (8)
    TROUBLE MODE a_PART C: GROUND FAULT BETWEEN C/U POWER SIDE AND PART C
    TROUBLE MODE b_PART C: DISCONNECTION BETWEEN C/U POWER SIDE AND PART C

REGION NUMBER (9)
    TROUBLE MODE c_PART C: SHORT IN PART C
    TROUBLE MODE d_PART C: DISCONNECTION IN PART C

REGION NUMBER (10)
    TROUBLE MODE e_PART C: GROUND FAULT BETWEEN PART C AND C/U GND SIDE
    TROUBLE MODE f_PART C: DISCONNECTION BETWEEN PART C AND C/U GND SIDE

REGION NUMBER (11)
    TROUBLE MODE a_PART D: GROUND FAULT BETWEEN C/U AND PART D
    TROUBLE MODE b_PART D: DISCONNECTION BETWEEN C/U AND PART D

REGION NUMBER (12)
    TROUBLE MODE c_PART D: SHORT IN PART D
    TROUBLE MODE d_PART D: DISCONNECTION IN PART D

REGION NUMBER (13)
    TROUBLE MODE e_PART D: DISCONNECTION BETWEEN PART D AND GND

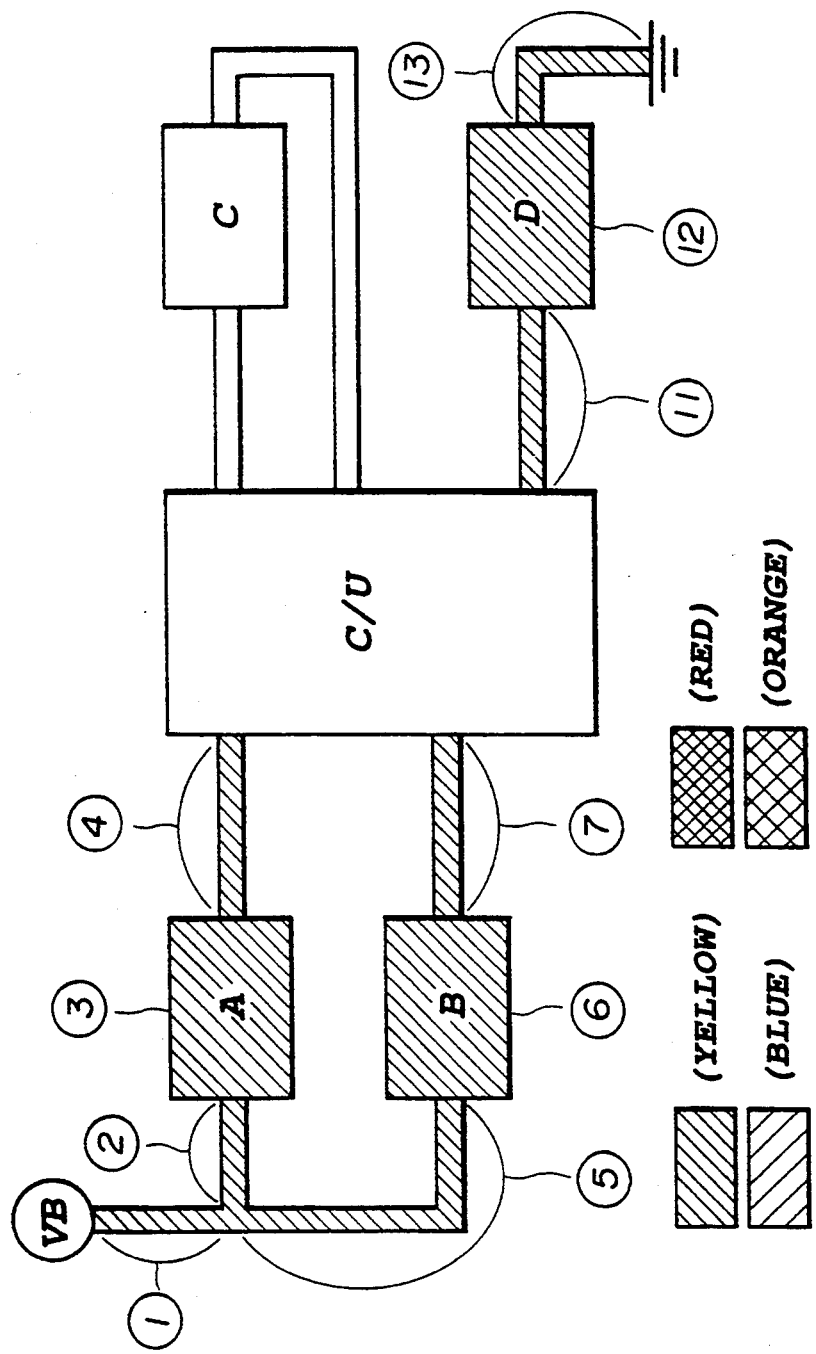

FIG.13

| TROUBLE MODE | LEVEL |
|---|---|
| TROUBLE MODE a_PART A: GROUND FAULT BETWEEN BATTERY AND PART A | -1.0 |
| TROUBLE MODE b_PART A: DISCONNECTION BETWEEN BATTERY AND PART A | -1.0 |
| TROUBLE MODE c_PART A: SHORT IN PART A | -1.0 |
| TROUBLE MODE d_PART A: DISCONNECTION IN PART A | -1.0 |
| TROUBLE MODE e_PART A: GROUND FAULT BETWEEN PART A AND C/U | -1.0 |
| TROUBLE MODE f_PART A: DISCONNECTION BETWEEN PART A AND C/U | -1.0 |

FIG.16

| TROUBLE MODE | LEVEL |
|---|---|
| TROUBLE MODE a_PART B: GROUND FAULT BETWEEN BATTERY AND PART B | -1.0 |
| TROUBLE MODE b_PART B: DISCONNECTION BETWEEN BATTERY AND PART B | -1.0 |
| TROUBLE MODE c_PART B: SHORT IN PART B | -1.0 |
| TROUBLE MODE d_PART B: DISCONNECTION IN PART B | -1.0 |
| TROUBLE MODE e_PART B: GROUND FAULT BETWEEN PART B AND C/U | -1.0 |
| TROUBLE MODE f_PART B: DISCONNECTION BETWEEN PART B AND C/U | -1.0 |

FIG.20

| TROUBLE MODE | LEVEL |
|---|---|
| TROUBLE MODE a_PART D: GROUND FAULT BETWEEN C/U AND PART D | 0.5 |
| TROUBLE MODE b_PART D: DISCONNECTION BETWEEN C/U AND PART D | 0.5 |
| TROUBLE MODE c_PART D: SHORT IN PART D | 0.5 |
| TROUBLE MODE d_PART D: DISCONNECTION IN PART D | 0.5 |
| TROUBLE MODE e_PART D: GROUND FAULT BETWEEN PART D AND GND | 0.5 |

FIG.22

| TROUBLE MODE | LEVEL |
|---|---|
| TROUBLE MODE a_PART D: GROUND FAULT BETWEEN C/U AND PART D | -1.0 |
| TROUBLE MODE b_PART D: DISCONNECTION BETWEEN C/U AND PART D | 0.5 |
| TROUBLE MODE c_PART D: SHORT IN PART D | 0.5 |
| TROUBLE MODE d_PART D: DISCONNECTION IN PART D | 0.5 |
| TROUBLE MODE e_PART D: GROUND FAULT BETWEEN PART D AND GND | 0.5 |

FIG.23

| TROUBLE MODE | LEVEL |
|---|---|
| TROUBLE MODE a_PART D: GROUND FAULT BETWEEN C/U AND PART D | -1.0 |
| TROUBLE MODE b_PART D: DISCONNECTION BETWEEN C/U AND PART D | -1.0 |
| TROUBLE MODE c_PART D: SHORT IN PART D | 0.5 |
| TROUBLE MODE d_PART D: DISCONNECTION IN PART D | 0.5 |
| TROUBLE MODE e_PART D: GROUND FAULT BETWEEN PART D AND GND | 0.5 |

FIG.25

| TROUBLE MODE | LEVEL |
|---|---|
| TROUBLE MODE a_PART D: GROUND FAULT BETWEEN C/U AND PART D | -1.0 |
| TROUBLE MODE b_PART D: DISCONNECTION BETWEEN C/U AND PART D | -1.0 |
| TROUBLE MODE c_PART D: SHORT IN PART D | 1.0 |
| TROUBLE MODE d_PART D: DISCONNECTION IN PART D | 0.5 |
| TROUBLE MODE e_PART D: GROUND FAULT BETWEEN PART D AND GND | 0.5 |

FIG.27

| TROUBLE MODE | LEVEL |
|---|---|
| TROUBLE MODE a_PART D: GROUND FAULT BETWEEN C/U AND PART D | -1.0 |
| TROUBLE MODE b_PART D: DISCONNECTION BETWEEN C/U AND PART D | -1.0 |
| TROUBLE MODE c_PART D: SHORT IN PART D | -1.0 |
| TROUBLE MODE d_PART D: DISCONNECTION IN PART D | -1.0 |
| TROUBLE MODE e_PART D: GROUND FAULT BETWEEN PART D AND GND | -1.0 |

FIG.29

| TROUBLE MODE | LEVEL |
|---|---|
| TROUBLE MODE a_PART D: GROUND FAULT BETWEEN C/U AND PART D | 0.5 |
| TROUBLE MODE b_PART D: DISCONNECTION BETWEEN C/U AND PART D | 0 |
| TROUBLE MODE c_PART D: SHORT IN PART D | 0.5 |
| TROUBLE MODE d_PART D: DISCONNECTION IN PART D | 0 |
| TROUBLE MODE e_PART D: GROUND FAULT BETWEEN PART D AND GND | 0 |

FIG.31

| TROUBLE MODE | LEVEL |
|---|---|
| TROUBLE MODE a_PART D: GROUND FAULT BETWEEN C/U AND PART D | 0 |
| TROUBLE MODE b_PART D: DISCONNECTION BETWEEN C/U AND PART D | 0.5 |
| TROUBLE MODE c_PART D: SHORT IN PART D | 0 |
| TROUBLE MODE d_PART D: DISCONNECTION IN PART D | 0.5 |
| TROUBLE MODE e_PART D: GROUND FAULT BETWEEN PART D AND GND | 0.5 |

FIG.37

REGION NUMBER (5)

TROUBLE MODE a_PART A : GROUND FAULT BETWEEN BATTERY AND PART A
TROUBLE MODE b_PART A : DISCONNECTION BETWEEN BATTERY AND PART A
TROUBLE MODE c_PART A : SHORT IN PART A
TROUBLE MODE d_PART A : DISCONNECTION IN PART A
TROUBLE MODE e_PART A : GROUND FAULT BETWEEN C/U AND PART A
TROUBLE MODE f_PART A : DISCONNECTION BETWEEN C/U AND PART A
TROUBLE MODE a_PART B : GROUND FAULT BETWEEN BATTERY AND PART B
TROUBLE MODE b_PART B : DISCONNECTION BETWEEN BATTERY AND PART B
TROUBLE MODE c_PART B : SHORT IN PART B
TROUBLE MODE d_PART B : DISCONNECTION IN PART B
TROUBLE MODE e_PART B : GROUND FAULT BETWEEN PART B AND C/U
TROUBLE MODE f_PART B : DISCONNECTION BETWEEN PART B AND C/U

FIG. 38

| TROUBLE MODE | LEVEL |
|---|---|
| TROUBLE MODE a_PART A: GROUND FAULT BETWEEN BATTERY AND PART A | -1.0 |
| TROUBLE MODE b_PART A: DISCONNECTION BETWEEN BATTERY AND PART A | -1.0 |
| TROUBLE MODE c_PART A: SHORT IN PART A | -1.0 |
| TROUBLE MODE d_PART A: DISCONNECTION IN PART A | -1.0 |
| TROUBLE MODE e_PART A: GROUND FAULT BETWEEN PART A AND C/U | -1.0 |
| TROUBLE MODE f_PART A: DISCONNECTION BETWEEN PART A AND C/U | -1.0 |

FIG.40

| TROUBLE MODE | LEVEL |
|---|---|
| TROUBLE MODE a_PART B: GROUND FAULT BETWEEN BATTERY AND PART B | -1.0 |
| TROUBLE MODE b_PART B: DISCONNECTION BETWEEN BATTERY AND PART B | -1.0 |
| TROUBLE MODE c_PART B: SHORT IN PART B | -1.0 |
| TROUBLE MODE d_PART B: DISCONNECTION IN PART B | -1.0 |
| TROUBLE MODE e_PART B: GROUND FAULT BETWEEN PART B AND C/U | -1.0 |
| TROUBLE MODE f_PART B: DISCONNECTION BETWEEN PART B AND C/U | -1.0 |

FIG.43
PART A — PART A / CABLES BETWEEN BATTERY AND PART A / CABLES BETWEEN PART A AND C/U
PART B — PART B / CABLES BETWEEN BATTERY AND PART B / CABLES BETWEEN PART B AND C/U
PART C — PART C / CABLES (1) BETWEEN PART C AND C/U / CABLES (2) BETWEEN C/U AND PART C
PART D — PART D / CABLES BETWEEN PART D AND C/U / CABLES BETWEEN PART D AND GND
 (BLUE)
 (ORANGE)
 (RED)

TROUBLE CHECKING APPARATUS

BACKGROUND OF THE INVENTION

This invention relates to an apparatus for checking a trouble produced in a circuit or system and, more particularly to a trouble checking apparatus which provides a graphic presentation of a defective region or regions included in the system.

Trouble checking apparatus have been used in checking a defective region or regions of an electronic engine control circuit (C/U) used in an automotive vehicle for controlling the engine based upon vehicle opera ting conditions sensed by various sensors including an engine coolant temperature sensor, an idle switch, a transmission neutral position switch, etc. The conventional trouble checking apparatus employs a digital computer communicated with the engine control circuit. The digital computer includes a central processing unit and a memory. The central processing unit processes the data input ted from the engine control circuit, the data inputted through a keyboard and the data stored in the memory to make trouble checks for the engine control circuit. The check results are displayed on a display unit. With the conventional trouble checking apparatus, however, the check results are displayed in the form of short sentences comprised of characters. Therefore, it is difficult for the operator to seize the entire picture of the defective condition of the checked circuit or system.

SUMMARY OF THE INVENTION

It is a main object of the invention to provide an improved trouble checking apparatus which can provide a graphic presentation of a defective region or regions so as to provide the entire picture of a defective condition of the checked circuit or system.

There is provided, in accordance with the invention, an apparatus for checking a trouble in a system. The trouble checking apparatus comprises input means for inputting data related to operating conditions of the system to be checked, checking means for checking a defective condition for each of different regions of the system to provide a result based upon the input ted data, display means for providing a graphic presentation of the system, and control means for providing different representations for each of the regions of the presented system based upon the result.

BRIEF DESCRIPTION OF THE DRAWINGS

The invention will be described in greater detail by reference to the following description taken in connection with the accompanying drawings, in which:

FIG. 4 is a list of trouble modes specified for the respective parts included in the specified circuit;

FIG. 5 is a list of trouble mode levels in connection with the corresponding colors in which the regions are presented on the display unit;

FIG. 6 is a list showing the levels initialized for the respective trouble modes;

FIG. 7 is a circuit diagram showing the regions included in the specified circuit to be checked;

FIG. 8 is a list showing the trouble modes related to the respective region numbers;

FIG. 9 is a circuit diagram showing the regions presented on the display unit in different colors;

FIG. 13 is a list showing the levels set for the respective trouble modes related to the part A;

FIG. 16 is a list showing the levels set for the respective trouble modes related to the part B;

FIG. 20 is a list showing the levels set for the respective trouble modes related to the part D;

FIG. 22 is a list showing the levels set for the respective trouble modes related to the part D;

FIG. 23 is a list showing the levels set for the respective trouble modes related to the part D;

FIG. 25 is a list showing the levels set for the respective trouble modes related to the part D;

FIG. 27 is a list showing the levels set for the respective trouble modes related to the part D;

FIG. 29 is a list showing the levels set for the respective trouble modes related to the part D;

FIG. 31 is a list showing the levels set for the respective trouble modes related to the part D;

FIG. 37 is a list showing the trouble modes related to a region number;

FIG. 38 is a list showing the levels set for the respective trouble modes related to the part A;

FIG. 40 is a list showing the levels set for the respective trouble modes related to the part B;

FIG. 43 is a diagram used in explaining another manner in which the checked regions are presented on the display unit.

DETAILED DESCRIPTION OF THE INVENTION

Figure 1:
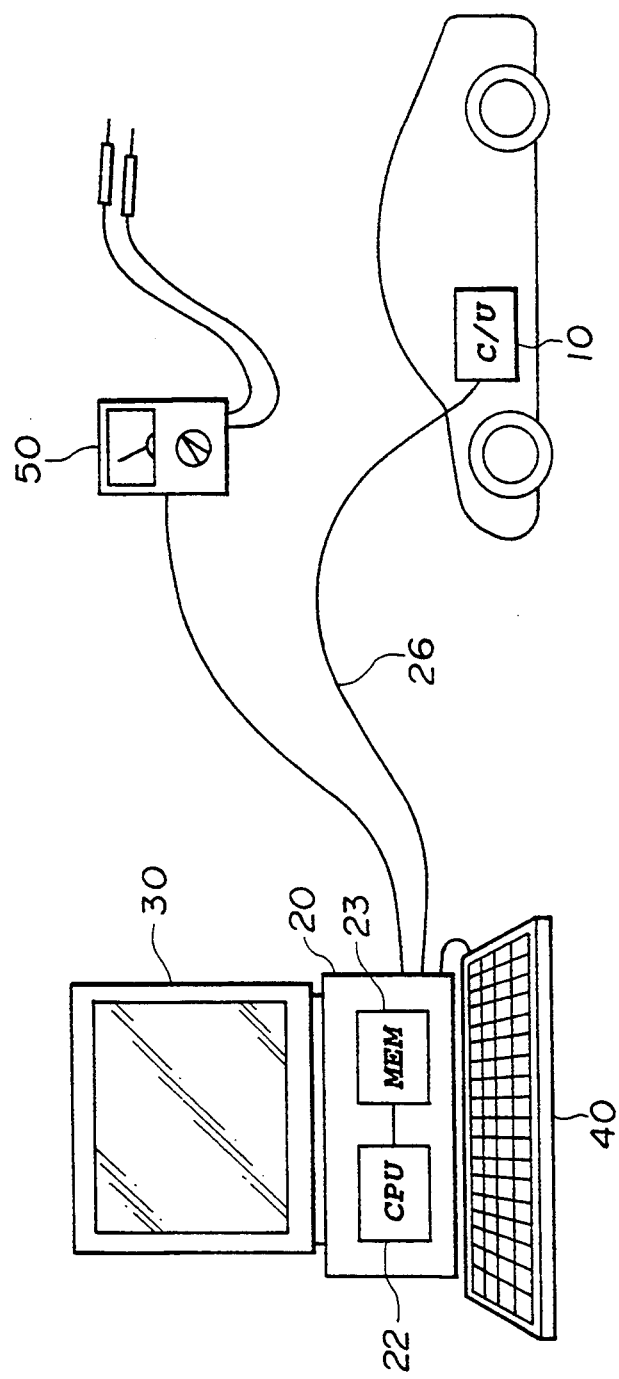
FIG. 1 is a schema tic diagram showing one embodiment of a trouble checking apparatus made in accordance with the invention.

With reference to the drawings and in particular to FIG. 1, there is shown a schematic diagram of a trouble checking apparatus embodying the invention. The trouble checking apparatus, generally designated by the numeral 20, is shown as connected to an engine control unit (C/U) 10 provided in an automotive vehicle. The engine control unit 10 receives sensor signals indicative of information on the vehicle and engine operating conditions and produces control signals for operating various actuators to control an internal combustion engine. The sensor signals are fed to the engine control unit 10 from various sensors including an engine coolant sensor, an idle switch, a transmission neutral position switch, etc. The trouble checking apparatus 20 includes a digital computer which includes a central processing unit (CPU) 22 and a memory unit (MEM) 23 and also employs a display unit 30 and a keyboard 40. The trouble checking apparatus 20 receives the values of the sensor and control signals through data bus 26 from the engine control unit 10 and check troubles which may occur in the automotive vehicle. The trouble checking apparatus 20 also receives data fed there to from a tester 50 used in measuring the voltage, current, resistance and the like of each of the parts or components included in the circuit or system to be checked.

Figure 2:
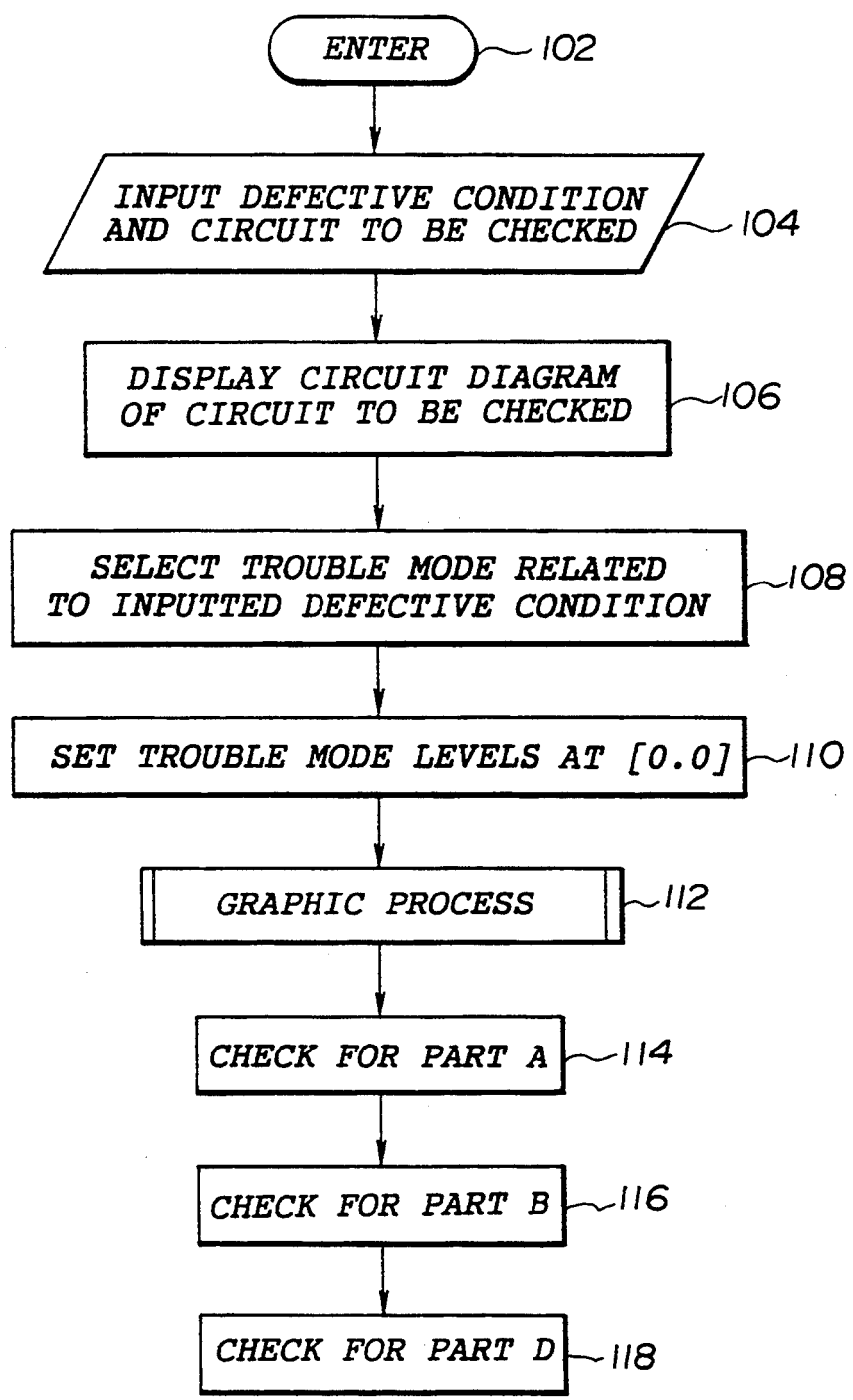
FIG. 2 is a flow diagram showing the programming of the digital computer.
Figure 3:
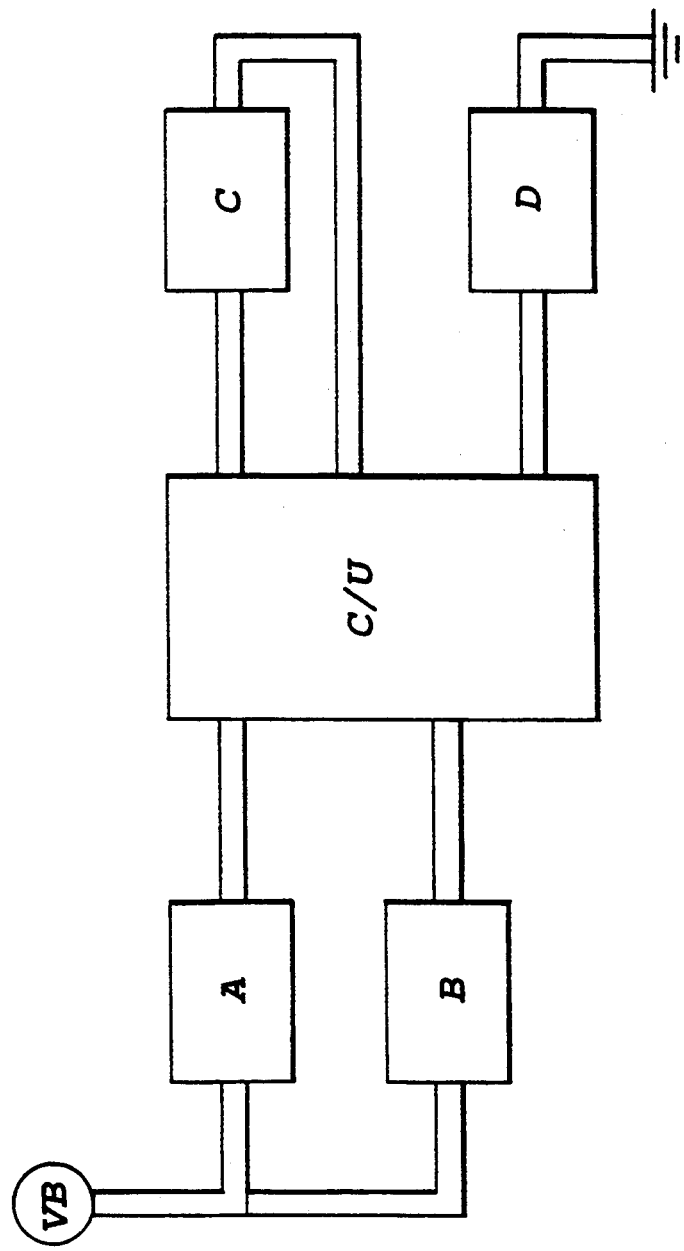
FIG. 3 is a circuit diagram showing a specified circuit or system presented on the display unit.

FIG. 2 is an overall flow diagram illustrating the programming of the digital computer. The computer program is entered at the point 102 in the program. At the point 104 in the program, the defective condition, such as "unstable idle rotation", and the circuit or system to be checked, such as "engine control unit (C/U)", are inputted through the keyboard 40. At the point 106 in the program, the circuit diagram related to the inputted circuit or system is searched in the computer memory 23 and presented on the display unit 30, as shown in FIG. 3. At the point 108 in the program, the central processing unit 22 selects a trouble mode which may be considered as a cause of the inputted defective condition. This selection is made from a relationship stored in the computer memory 23. This relationship specifies a trouble mode as a function of defective condition and region. For this purpose, the relationship includes a trouble mode stored for each of the combinations of defective condition and region, as shown in FIG. 4. For example, the part A is an AAC valve used for controlling the auxiliary air flow to the engine, the part B may be an FICD valve used for controlling the auxiliary air flow to the engine when the air conditioner is operating, and the part D may be an engine coolant temperature sensor. At the point 110 in the program, the central processing unit 22 sets the trouble mode levels at [0.0]. The trouble mode level indicates a degree of the possibility of the trouble. For example, the degree of the possibility of the trouble is at minimum when the trouble mode level is [−1.0]. The trouble mode level increases in the order of [0.0], [0.5] and [1.0] as the possibility degree increases, as shown in FIG. 5. The possibility degree is at maximum when the trouble mode level is [1.0]. The trouble mode level [−1.0] indicates that no trouble occurs in the corresponding part. The trouble mode level [0.0] indicates that the possibility exists that a trouble occurs in the corresponding part. The trouble mode level [0.5] indicates a higher degree of the possibility of a trouble in the corresponding part. The trouble mode level [1.0] indicates that a trouble occurs in the corresponding part. The presentation is made in different colors corresponding to the respective trouble mode levels. For example, the defective part is represented in blue when the trouble mode level is [−1.0], in yellow when the trouble mode level is [0.0], in orange when the trouble mode level is [0.5], and in red when the trouble mode level is [1.0], as shown in FIG. 5. In the first cycle of execution of this program, the trouble mode levels are set at [0.0] for all of the trouble modes, as shown in FIG. 6.

At the point 112 in the program, a graphic process is performed to change the color in which a specified region is presented on the display unit 30 according to the trouble mode levels given therefor. The regions are designated by different region numbers, as shown in FIG. 7. As shown in FIG. 8, the region numbers are stored in connection with the trouble modes of FIG. 4. In the first cycle of execution of this program, all of the regions are presented in yellow since all of the trouble mode levels are set at [0.0], as shown in FIG. 9. At the point 114 in the program, the central processing unit 22 checks a part A included in the specified region. At the point 116 in the program, the central processing unit 22 checks another part B included in the specified region. At the point 118 in the program, the central processing unit 22 checks still another part D included in the specified region.

In the preceding paragraphs, the steps at the points 112, 114, 116 and 118 in the program of FIG. 2 were not described in detail. This detail is presented in the following subsection.

Figure 10:
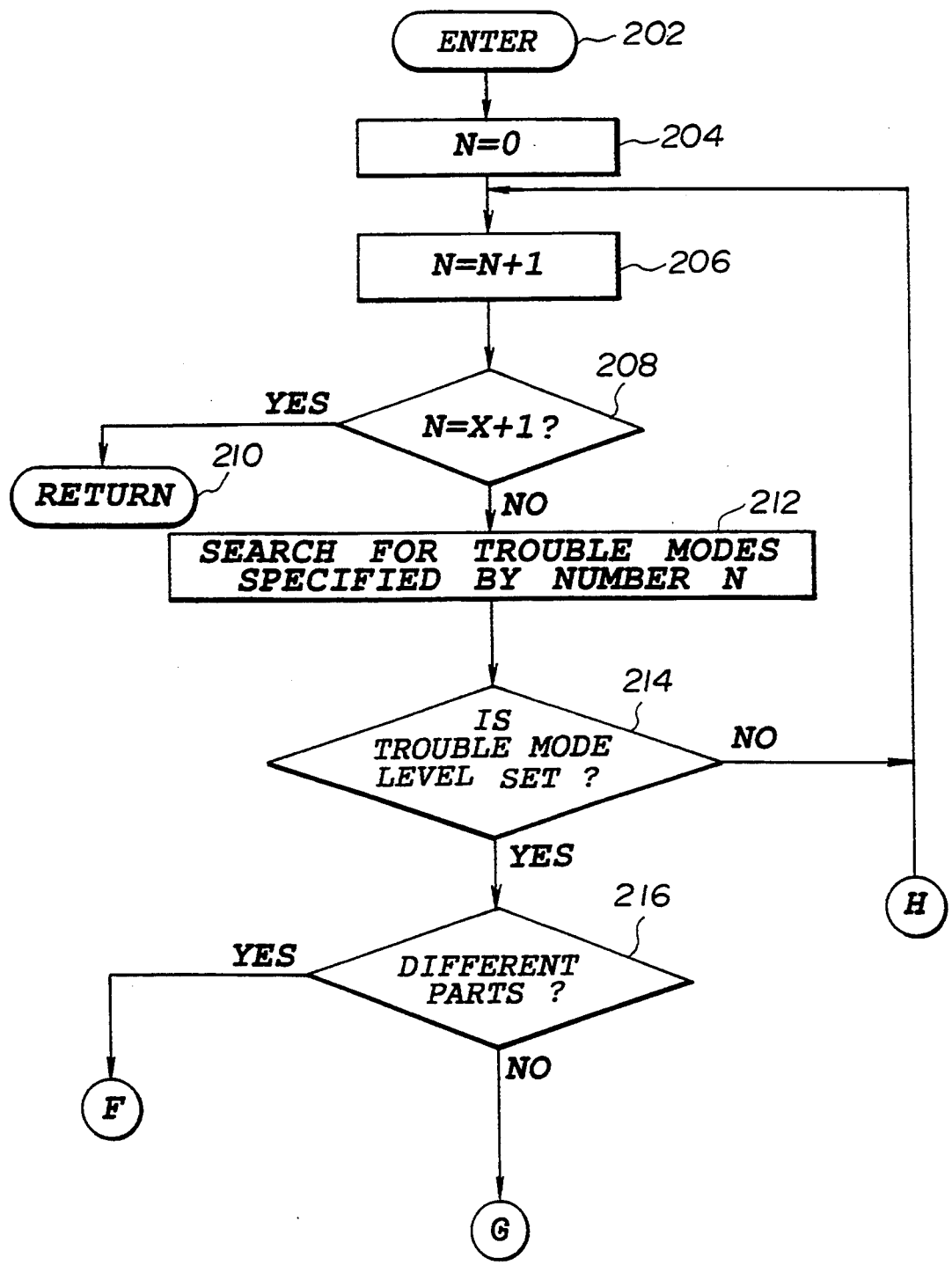
FIGS. 10 and 11 are flow diagrams showing the programming of the digital computer as it is used for the graphic process.
Figure 11:
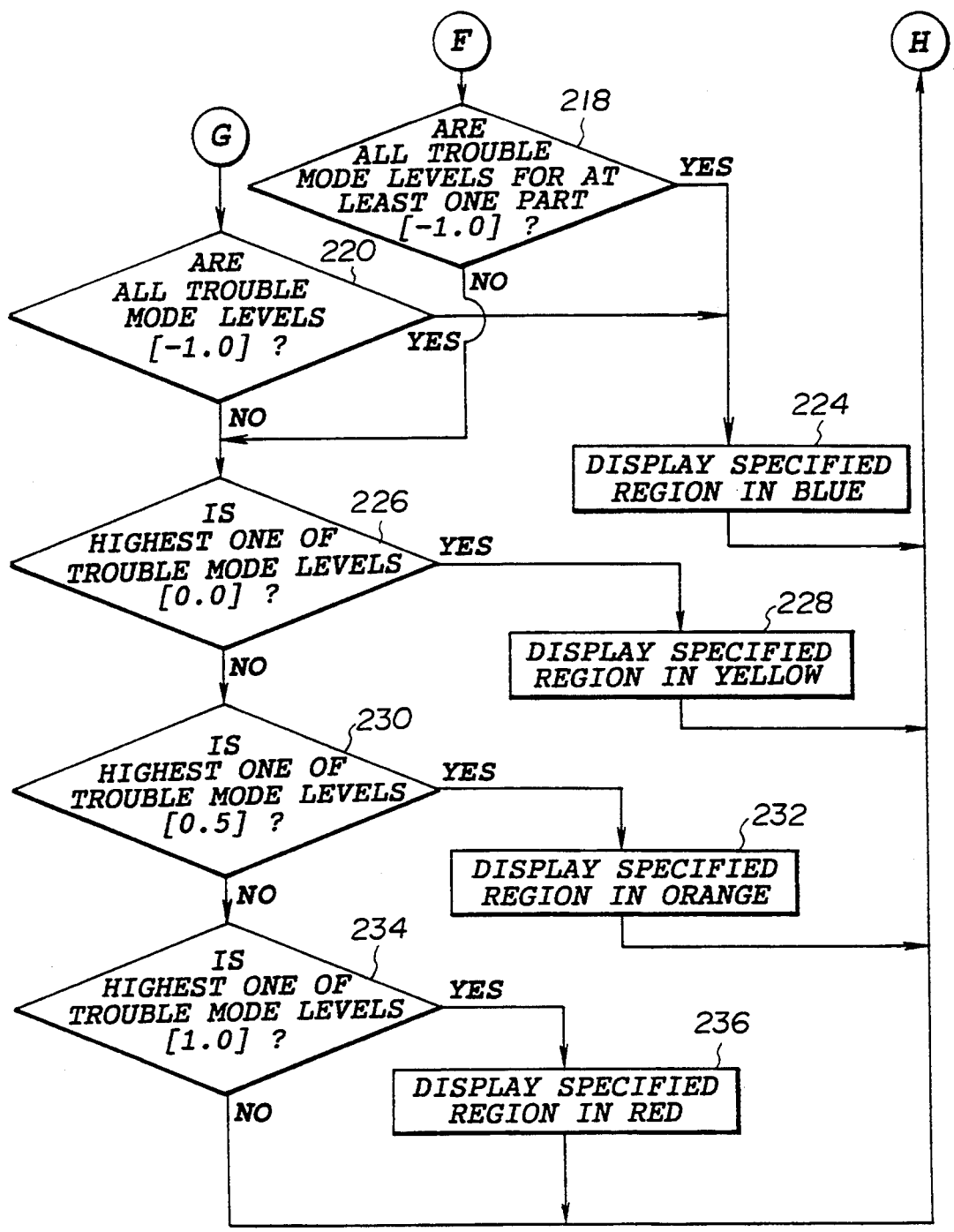

FIGS. 10 and 11 are flow diagrams illustrating the above graphic process. At the point 202 in FIG. 10, which corresponds to the point 112 of FIG. 2, the computer program is entered. At the point 204 in the program, the count N of a region number counter is initialized to zero. This count N specifies a region number. At the point 206 in the program, the count N of the region number counter is incremented by one step. At the point 208 in the program, a determination is made as to whether or not the count N is equal to X+1 where X is the greatest one of the region number N. If the answer to this question is "yes", then it means that the graphic process for the presented circuit diagram has been completed and the program proceeds to the point 210 where the computer program is returned to the entry point 202. Otherwise, the program proceeds to the point 212 where the central processing unit searches for the trouble modes specified by the region number N. Assuming now that the region number N is "1", the trouble mode a_part A, the trouble mode b_part A, the trouble mode a_part B, and the trouble mode b_part B are picked up.

At the point 214 in the program, a determination is made as to whether or not the trouble mode level has been set for the region number N. If the answer to this question is "no", then the program is returned to the point 206. Otherwise, the program proceeds to the point 216. For example, since all of the levels of the trouble modes specified by the region number "1", that is, the trouble mode a_part A, the trouble mode b_part A, the trouble mode a_part B, and the trouble mode b_part B, have been set at [0.0], the program proceeds to the point 216. Since the trouble modes specified by the region number "8", that is, the trouble mode a_part C and the trouble mode b_part C, are not related to the inputted defective condition and the trouble mode levels therefor have not been set, however, the program proceeds to the point 206.

At the point 216 in the program, a determination is made as to whether or not different parts exist for the trouble modes specified by the region number N. If the answer to this question is "yes", then the program proceeds to the point 218. Otherwise, the program proceeds to the point 220. For example, different parts A and B exist for the trouble modes specified by the region number "1", that is, for the trouble mode a_part A, the trouble mode b_part A, the trouble mode a_part B, and the trouble mode b_part B. Thus, if the region number is "1", the program will proceed to the point 218. For example, no part exists rather than the part A for the trouble modes specified by the region number "2", that is, for the trouble mode a_part A and the trouble mode b_part A. Thus, if the region number is "2", then the program will proceeds to the point 220.

At the point 218 in the program, a determination is made as to whether or not all of the levels of the specified trouble modes for at least one of the parts are [−1.0]. If the answer to this question is "yes", then it is considered that the region specified by the region number N is in order and the program proceeds to the point 224 where the region specified by the region number N is presented in blue. Following this, the program is returned to the point 206. Otherwise, the program proceeds from the point 218 to the point 226. For example, two parts A and B exists for the trouble modes specified by the region number "1", that is, for the trouble mode a_part A, the trouble mode b_part A, the trouble mode a_part B, and the trouble mode b_part B. In greater detail, the trouble modes include the trouble mode a_part A (ground fault between the battery and the part A), the trouble mode b_part A (disconnection between the battery and the part A), the trouble mode a_part B (ground fault between the battery and the part B), and the trouble mode b_part B (disconnection between the battery and the part B), as shown in FIG. 8. It is to be noted that the causes of the trouble "ground fault between the battery and the point X" and "disconnection between the battery and the point X" are common for the parts A and B. If the levels of the trouble mode a_part A and the trouble mode b_part A are [−1.0], the causes common for the region number "1" will be included in the trouble mode a_part A and the trouble mode b_part A. the part B may be considered as normal for the region corresponding to the region number "1".

At the point 220 in the program, a determination is made as to whether or not all of the trouble mode levels for the region number N are [−1.0]. If the answer to this question is "yes", then it means that the region is in order and the program proceeds to the point 224 where the region specified by the region number N is presented in blue. Following this, the program is returned to the point 206. Otherwise, the program proceeds from the point 220 to the point 226. It is now assumed that the region number is "2". If all of the levels of the trouble mode a_part A and the trouble mode b_part A are [−1.0], then it means that this region is in order and the program proceeds to the point 224. If either of the trouble mode a_part A and the trouble mode b_part is not [−1.0], then it means that a trouble may occur in this region.

At the point 226 in the program, a determination is made as to whether or not the highest one of the trouble mode levels for the region specified by the region number N is [0.0]. If the answer to this question is "yes", then it is considered that the possibility exists that a trouble occurs in this region and the program proceeds to the point 228 where the region specified by the region number N is presented in yellow. In this case, the existing trouble mode levels are [0.0] or a Combination of [−1.0] and [0.0]. Following this, the program is returned to the point 206. Otherwise, i t means the existing trouble mode level is higher than the level [0.0] and the program proceeds from the point 226 to the point 230. At the point 230 in the program, a determination is made as to whether or not the highest one of the trouble mode levels is [0.5]. If the answer to this question is "yes", then it means a higher degree of the possibility of a trouble in this region and the program proceeds to the point 232 where the region specified by the region number N is presented in orange. In this case, the existing trouble mode levels are [0.5] or a combination of [0.5], [0.0] and [−1.0]. Following this, the program is returned to the point 206. Otherwise, the program proceeds from the point 230 to the point 234. At the point 234 in the program, a determination is made as to whether or not the highest one of the trouble mode levels is [1.0]. If the answer to this question is "yes", then it means a trouble occurs in this region and the program proceeds to the point 236 where the region specified by the region number N is presented in red. In this case, the existing trouble mode levels are [1.0] or a combination of [1.0], [0.5], [0.0] and [1.0]. Following this, the program is returned to the point 206. Otherwise, the program is returned from the point 234 to the point 206.

Figure 12:
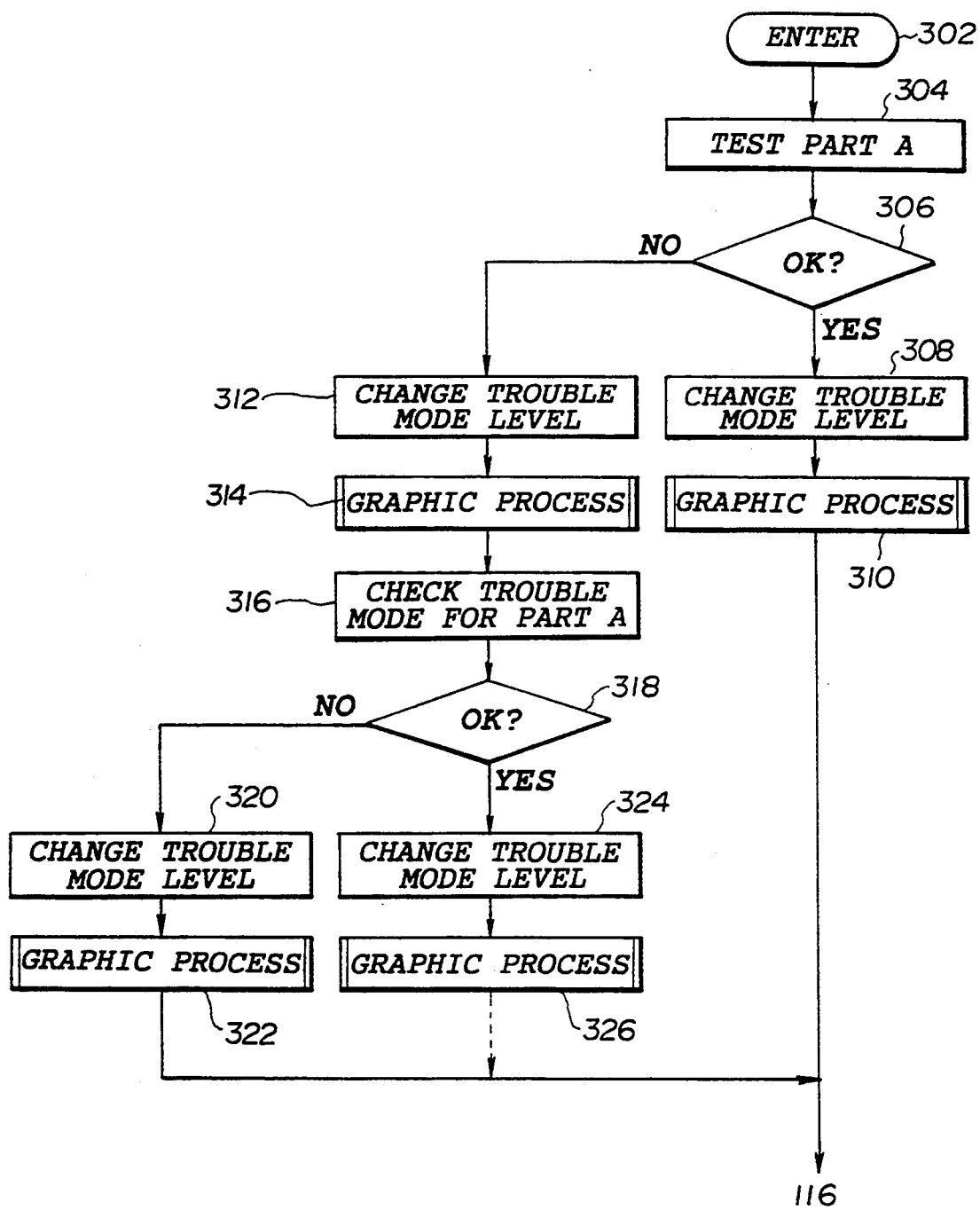
FIG. 12 is a flow diagram showing the programming of the digital computer as it is used to check the part A including the circuit to be checked.
Figure 14:
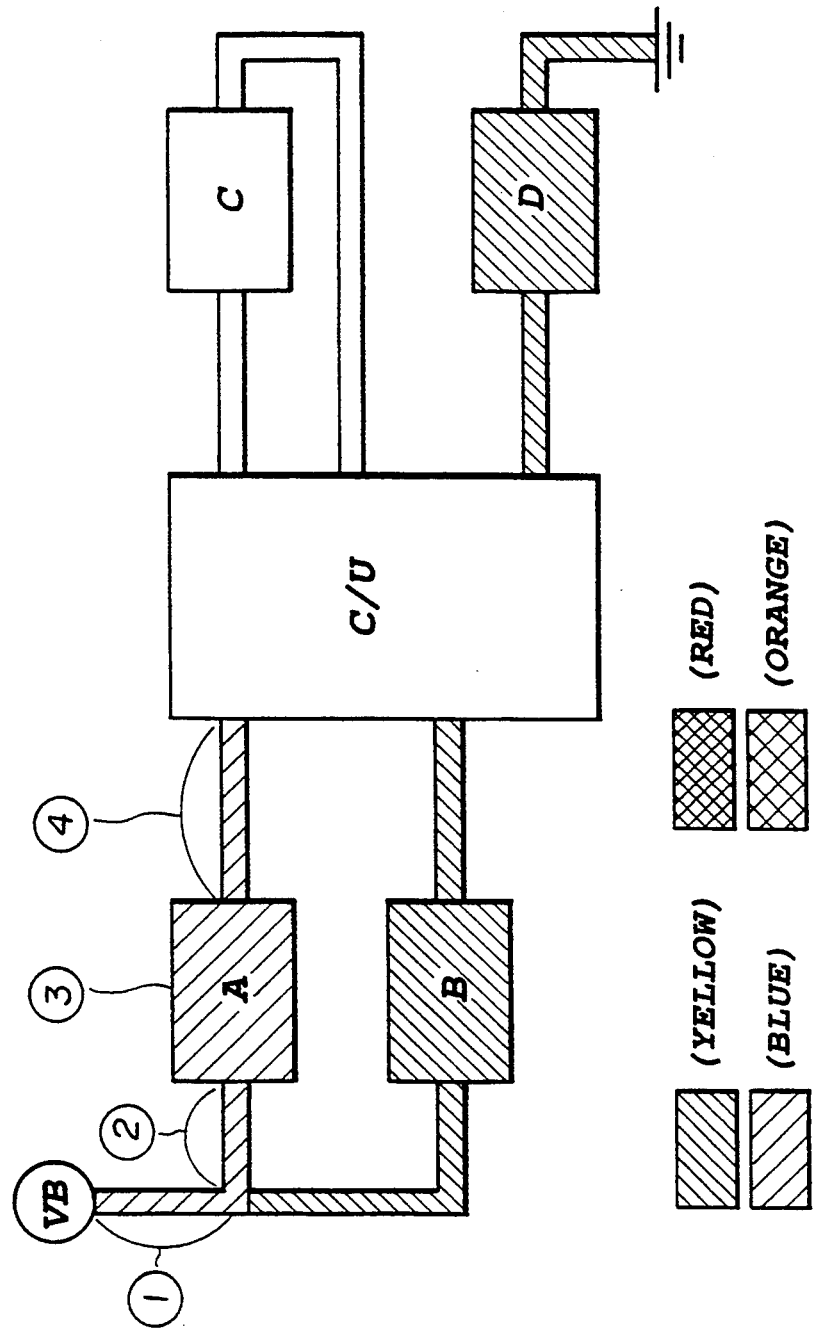
FIG. 14 is a circuit diagram showing the regions presented on the display unit in different colors.

FIG. 12 is a flow diagram illustrating the process for checking-the part A. At the point 302 in FIG. 12, which corresponds to the point 114 of FIG. 2, the computer program is entered. At the point 304 in the program, the part A is tested. Assuming now that the part A is a valve, it is tested by measuring the engine speed changes while changing the degree to which the valve opens. If the part A is a sensor, it may be tested by comparing the output voltage with upper and lower limits. At the point 306 in the program, a determination is made as to whether or not the part A is in order. If the answer to this question is "yes", then the program proceeds to the point 308 where the trouble mode levels related to the part A are changed to "−1.0" (FIG. 13) from "0" (FIG. 6). As a result, the corresponding region is presented in blue, as shown in FIG. 14. At the point 310, which corresponds to the point 202 of FIG. 10, a graphic process is performed as described in connection with the flow diagram of FIG. 10. Upon completion of this graphic process, the program proceeds to the point 116 of FIG. 2. If the answer to the question inputted at the point. 306 is "no" then the program proceeds to the point 312 where the trouble mode levels related to the part A are changed to "0.5". At the point 314, which corresponds to the point 202 of FIG. 10, in the program, a graphic process is performed as described in connection with the flow diagram of FIG. 10. Upon completion of this graphic process, the program proceeds to the point 316 where a trouble mode is checked for the part A. For example, if the trouble mode may be a_part A, the ground fault between the part A and the engine control unit (C/U) 10 is checked. For this purpose, an indication is provided on the display 30 to urge the operator to check the ground fault with the use of the tester 50. A t the point 318 in the program, a determination is made as to whether or not the trouble mode a—part A is in order for this check. If the answer to this question is "no", then the program proceeds to the point 320 where the level of the trouble mode is changed to "1.0". At the point 322, which corresponds to the point 202 of FIG. 10, a graphic process is performed as described in connection with the flow diagram of FIG. 10. Upon completion of this graphic process, the program proceeds to the point 116 of FIG. 2. If the answer to the question inputted at the point 318 is "yes", then the program proceeds to the point 324 where the level of the trouble mode is changed to "−1.0". At the point 326, which corresponds to the point 202 of FIG. 10, a graphic process is performed as described in connection with the flow diagram of FIG. 10. Upon completion of this graphic process, the program proceeds to the point 116 of FIG. 2 after a combination of steps similar to the steps as described in connection with the points 316–326 are repeated a predetermined number of times. This predetermined number is equal to the number of the trouble modes specified for the part A.

Figure 15:
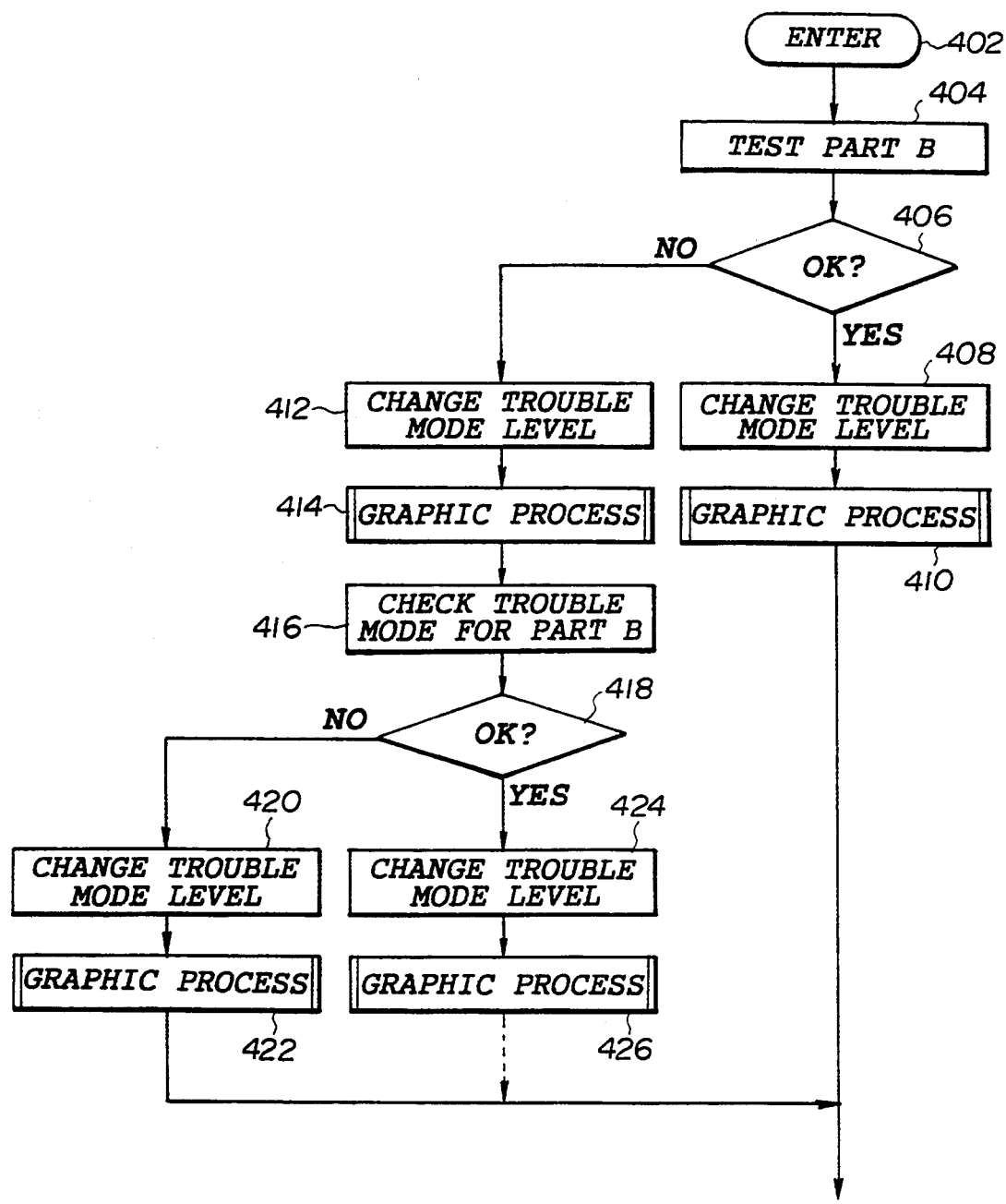
FIG. 15 is a flow diagram showing the programming of the digital computer as it is used to check the part B including the circuit to be checked.
Figure 17:
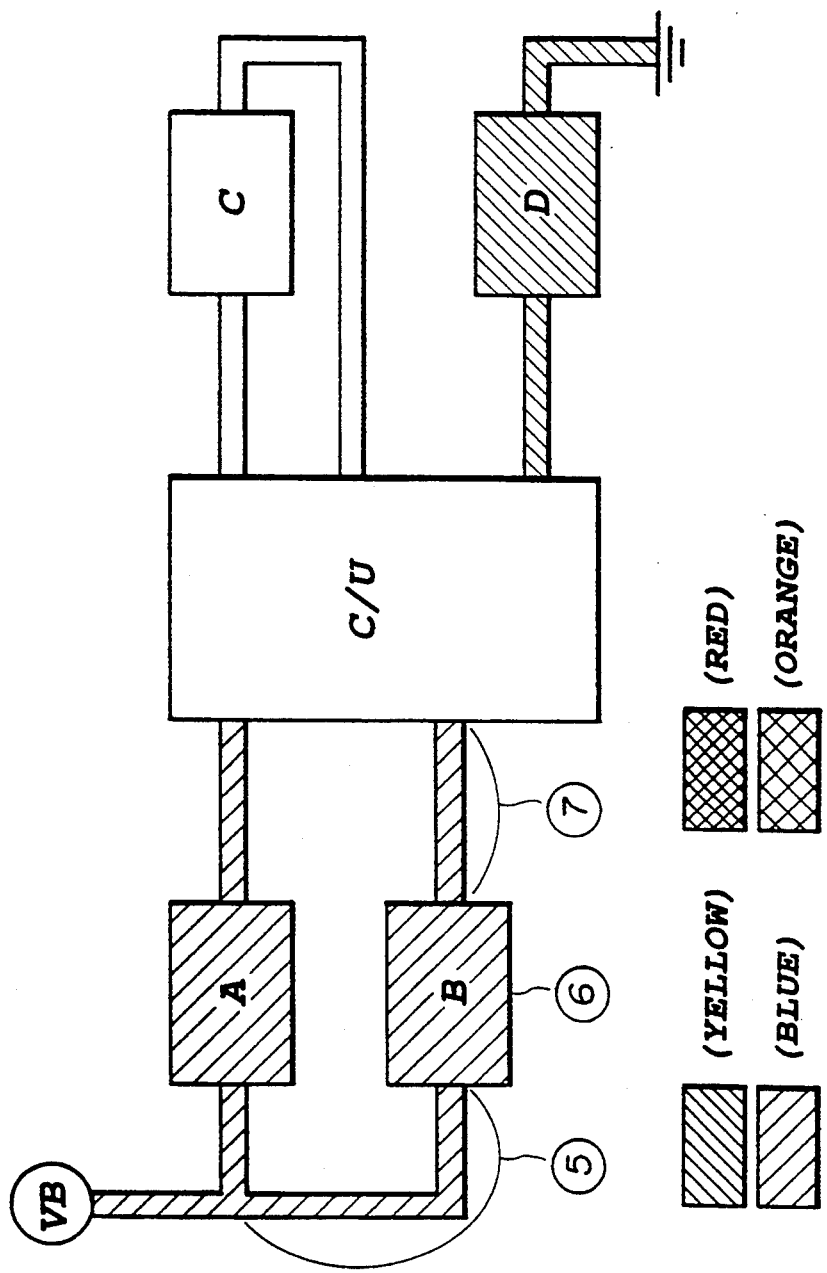
FIG. 17 is a circuit diagram showing the regions presented on the display unit in different colors.

FIG. 15 is a flow diagram illustrating the process for checking the part B. At the point 402 in FIG. 15, which corresponds to the point 116 of FIG. 2, the computer program is entered. At the point 404 in the program, the part B is tested. Assuming now that the part B is a valve, it is tested by measuring the engine speed changes while changing the degree to which the valve opens. If the part B is a sensor, it may be tested by comparing the output voltage with upper and lower limits. At the point 406 in the program, a determination is made as to whether or not the part B is in order. If the answer to this question is "yes", then the program proceeds to the point 408 where the trouble mode levels related to the part B are changed to "−1.0" (FIG. 16) from "0" (FIG. 6). As a result, the corresponding region is presented in blue, as shown in FIG. 17. At the point 410, which corresponds to the point 202 of FIG. 10, a graphic process is performed as described in connection with the flow diagram of FIG. 10. Upon completion of this graphic process, the program proceeds to the point 116 of FIG. 2. If the answer to the question inputted at the point 406 is "no", then the program proceeds to the point 412 where the trouble mode levels related to the part B are changed to "0.5". At the point 414, which corresponds to the point 202 of FIG. 10, in the program, a graphic process is performed as described in connection with the flow diagram of FIG. 10. Upon completion of this graphic process, the program proceeds to the point 416 where a trouble mode is checked for the part B. For example, if the trouble mode may be a—part B, the ground fault between the part B and the engine control unit (C/U) 10 is checked. For this purpose, an indication is provided on the display 30 to urge the operator to check the ground fault with the use of the tester 50. A t the point 418 in the program, a determination is made as to whether or not the trouble mode a—part B is in order for this check. If the answer to this question is "no" then the program proceeds to the point 420 where the level of the trouble mode is changed to "1.0". At the point 422, which corresponds to the point 202 of FIG. 10, a graphic process is performed as described in connection with the flow diagram of FIG. 10. Upon completion of this graphic process, the program proceeds to the point 116 of FIG. 2. If the answer to the question inputted at the point 418 is "yes", then the program proceeds to the point 424 where the level of the trouble mode is changed to "−1.0". A t the point 426, which corresponds to the point 202 of FIG. 10, a graphic process is performed as described in connection with the flow diagram of FIG. 10. Upon completion of this graphic process, the program proceeds to the point 116 of FIG. 2 after a combination of steps similar to the steps as described in connection with the points 416 to 426 are repeated a predetermined number of times. This predetermined number is equal to the number of the trouble modes specified for the part B.

Figure 18:
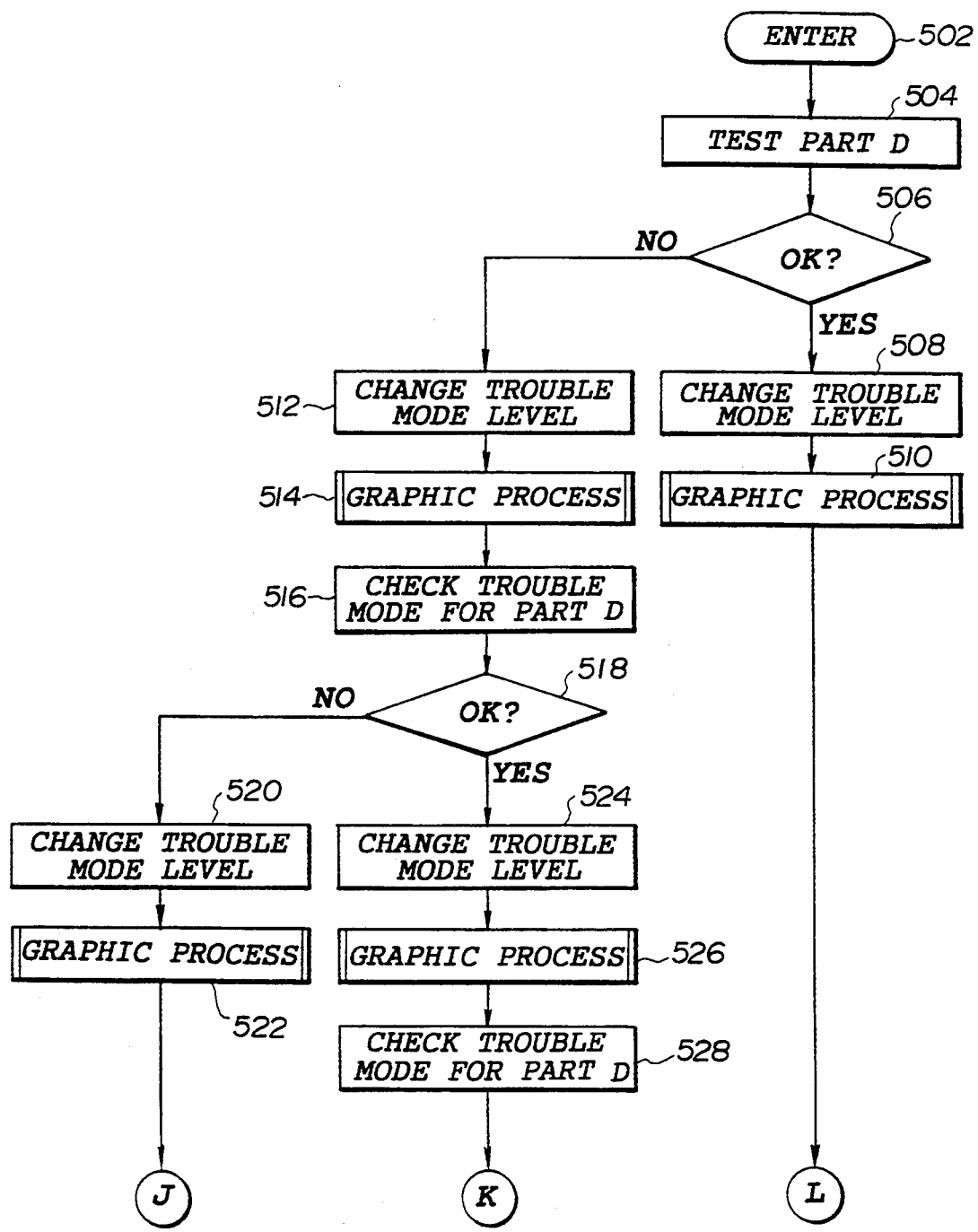
FIGS. 18 and 19 are flow diagrams showing the programming of the digital computer as it is used to check the part D including the circuit to be checked.
Figure 19:
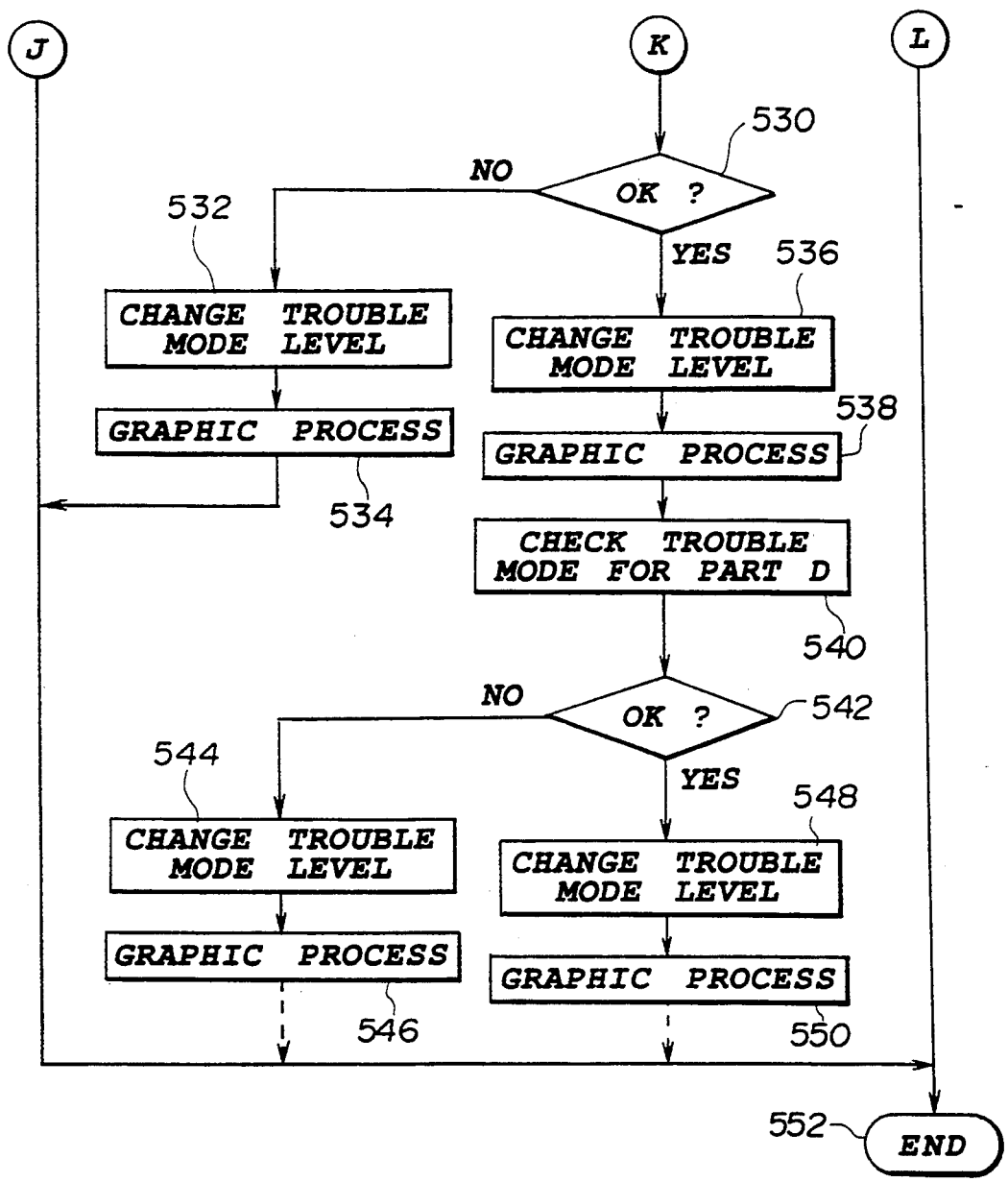
Figure 21:
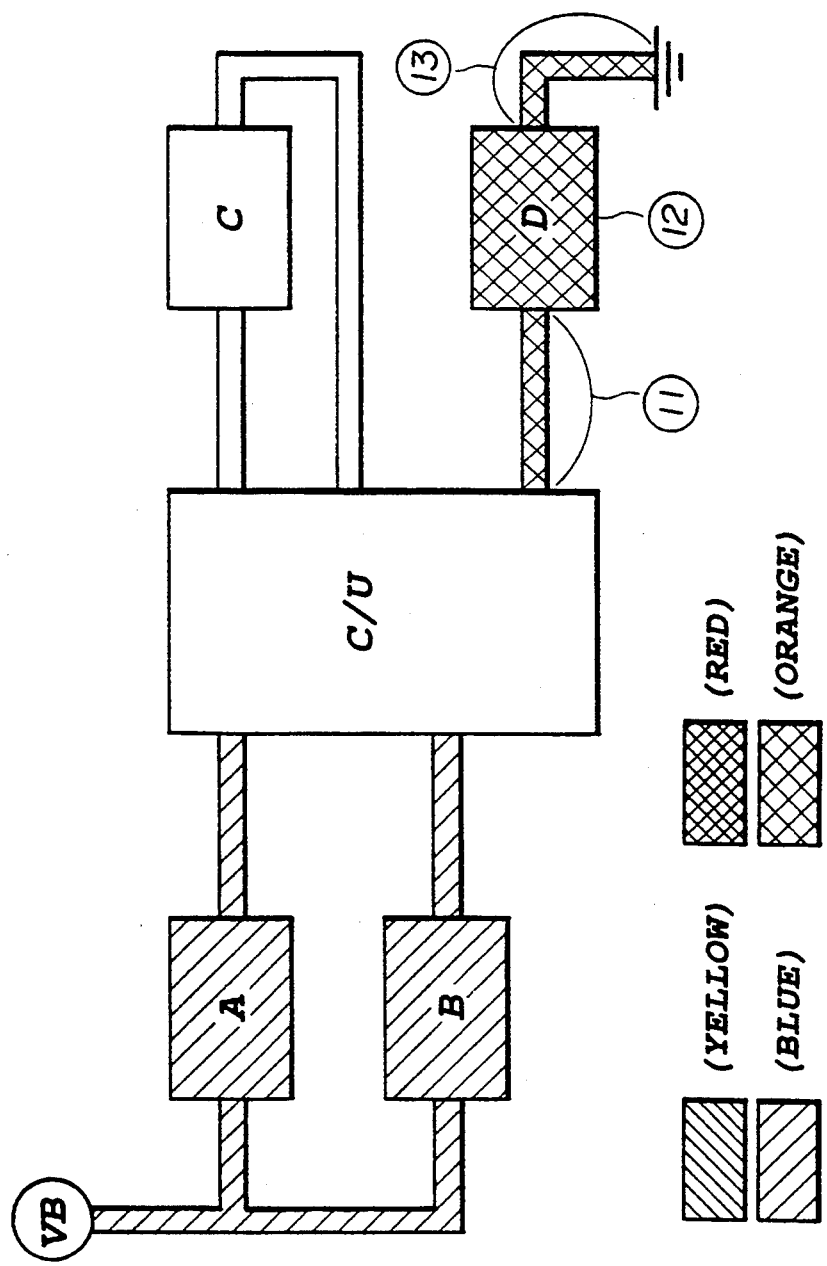
FIG. 21 is a circuit diagram showing the regions presented on the display unit in different colors.
Figure 24:
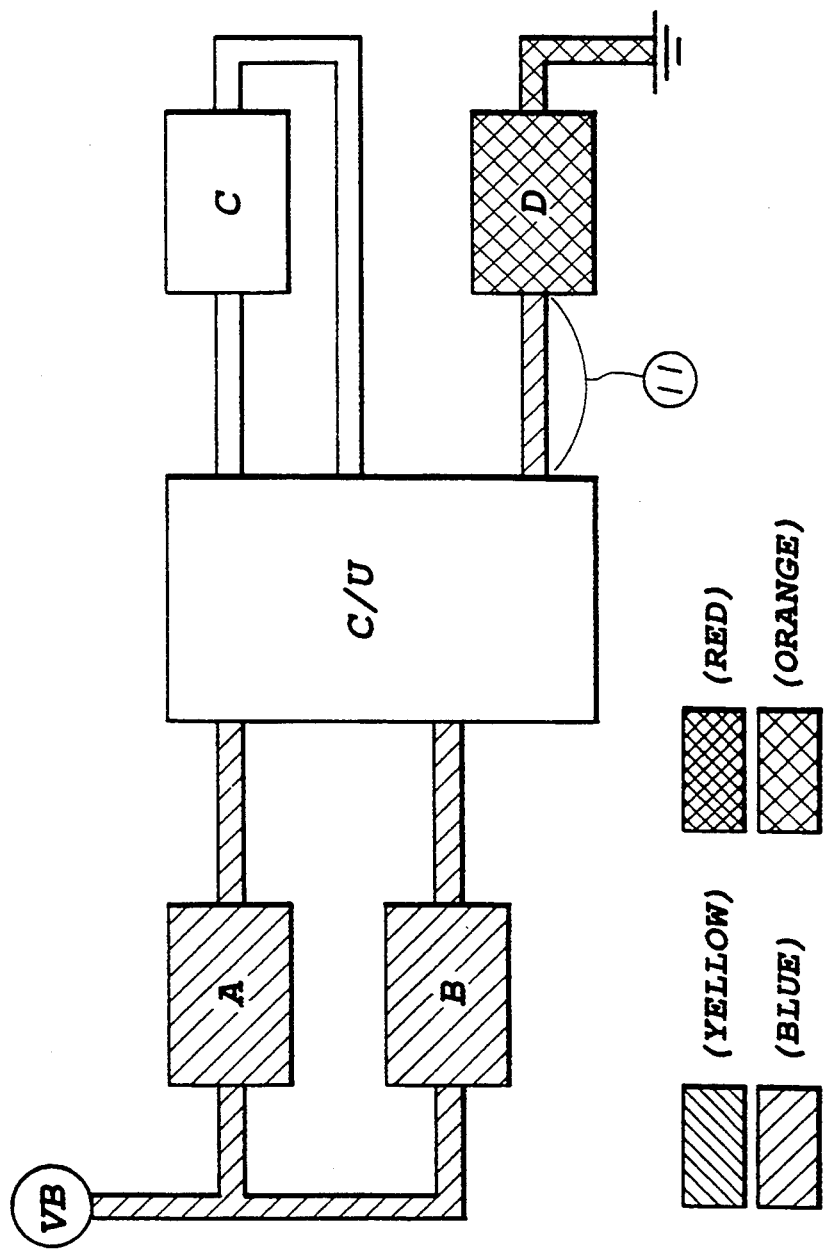
FIG. 24 is a circuit diagram showing the regions presented on the display unit in different colors.
Figure 26:
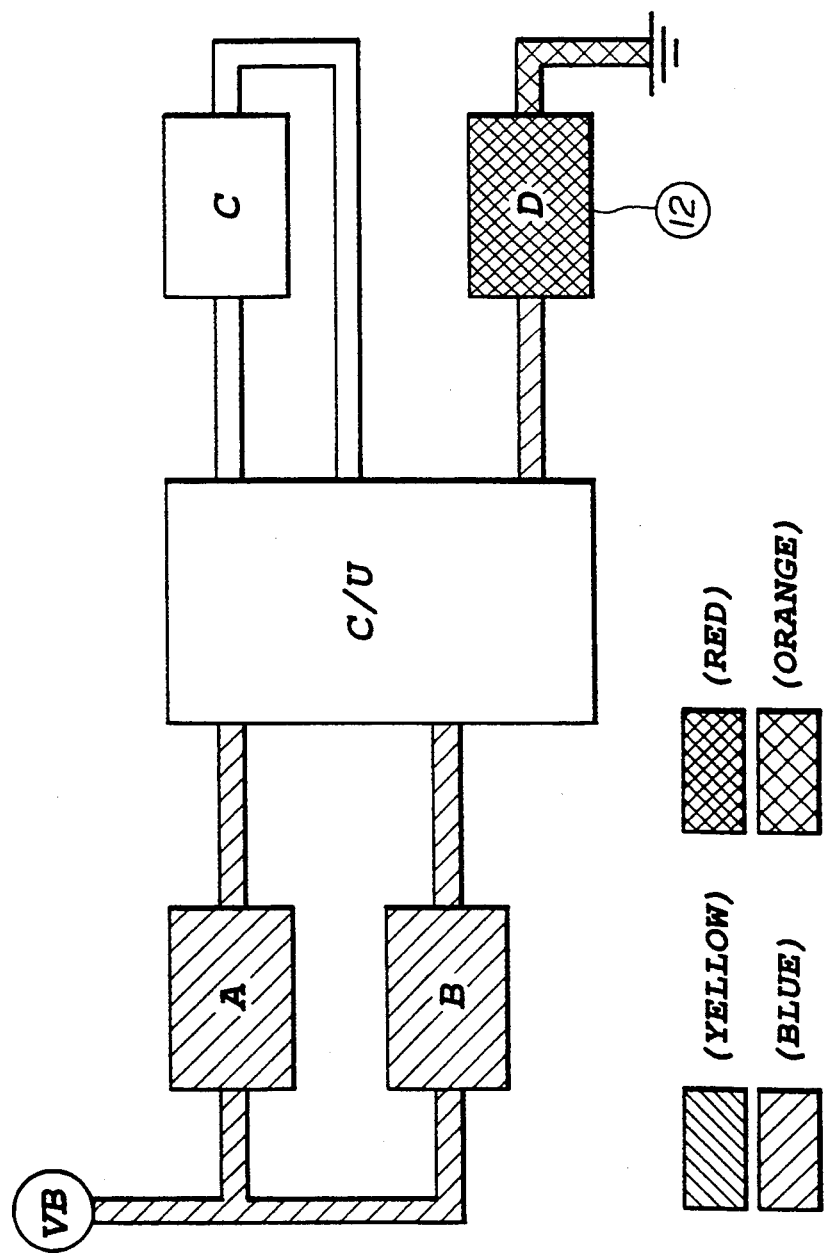
FIG. 26 is a circuit diagram showing the regions presented on the display unit in different colors.

FIGS. 18 and 19 are flow diagrams illustrating the process for checking the part D. At the point 502 in FIG. 15, which corresponds to the point 118 of FIG. 2, the computer program is entered. At the point 404 in the program, the part D is tested. Assuming now that the part D is a valve, it is tested by measuring the engine speed changes while changing the degree to which the valve opens. If the part D is a sensor, it may be tested by comparing the output voltage with upper and lower limits. A t the point 506 in the program, a determination is made as to whether or not the part D is in order. If the answer to this question is "yes", then the program proceeds to the point 508 where the trouble mode levels related to the part D are changed to "−1.0" from "0" (FIG. 6). As a result, the corresponding region is presented in blue. At the point 510, which corresponds to the point 202 of FIG. 10, a graphic process is performed as described in connection with the flow diagram of FIG. 10. Upon completion of this graphic process, the program proceeds to the end point 552. If the answer to the question inputted at the point 506 is "no", then the program proceeds to the point 512 where the trouble mode levels related to the part B are changed to "0.5", as shown in FIG. 20. At the point 514, which corresponds to the point 202 of FIG. 10, in the program, a graphic process is performed as described in connection with the flow diagram of FIG. 10. As a result, the corresponding circuit or region is presented in orange as shown in FIG. 21. Upon completion of this graphic process, the program proceeds to the point 516 where a trouble mode is checked for the part D. For example, if the trouble mode may be a—part D, the ground fault between the part D and the engine control unit (C/U) 10 is checked. For this purpose, an indication is provided on the display 30 to urge the operator to check the ground fault with the use of the tester 50. At the point 518 in the program, a determination is made as to whether or not the trouble mode a—part D is in order for this check. If the answer to this question is "no", then the program proceeds to the point 520 where the level of the trouble mode is changed to "1.0". At the point 522, which corresponds to the point 202 of FIG. 10, a graphic process is performed as described in connection with the flow diagram of FIG. 10. Upon completion of this graphic process, the program proceeds to the end point 552. If the answer to the question inputted at the point 518 is "yes", then the program proceeds to the point 524 where the level of the trouble mode (for example, trouble mode a—part D) is changed to "−1.0", as shown in FIG. 22. A t the point 526, which corresponds to the point 202 of FIG. 1 0, a graphic process is performed as described in connection with the flow diagram of FIG. 10. Upon completion of this graphic process, the program proceeds to the point 528 where another trouble mode is checked for the part D. For example, if the trouble mode may be b—part D, the disconnection between the part D and the engine control unit (C/U) 10 is checked. For this purpose, an indication is provided on the display 30 to urge the operator to check the disconnection with the use of the tester 50. A t the point 530 in the program, a determination is made as to whether or not the trouble mode b—part D is in order for this check. If the answer to this question is "no", then the program proceeds to the point 532 where the level of the trouble mode is changed to "1.0". At the point 534, which corresponds to the point 202 of FIG. 10, a graphic process is performed as described in connection with the flow diagram of FIG. 10. Upon completion of this graphic process, the program proceeds to the end point 552. If the answer to the question inputted at the point 530 is "yes", then the program proceeds to the point 536 where the level of the trouble mode (for example, trouble mode b—part D) is changed to "−1.0", as shown in FIG. 23. At the point 538, which corresponds to the point 202 of FIG. 10, a graphic process is performed made as described in connection with the flow diagram of FIG. 10 so as to present the corresponding region in blue, as shown in FIG. 24. Upon completion of this graphic process, the program proceeds to the point 540 where another trouble mode is checked for the part D. For example, if the trouble mode may be c—part D, the short in the part D is checked. For this purpose, an indication is provided on the display 30 to urge the operator to check the short in the part D with the use of the tester 50. At the point 542 in the program, a determination is made as to whether or not the trouble mode c—part D is in order for this check. If the answer to this question is "no", then the program proceeds to the point 544 where the level of the trouble mode (for example, trouble mode c—part D) is changed to "1.0", as shown in FIG. 25. At the point 546, which corresponds to the point 202 of FIG. 10, a graphic process is performed as described in connection with the flow diagram of FIG. 10 so as to present the corresponding circuit or region in red, as shown in FIG. 26. Upon completion of this graphic process, the program proceeds to the end point 552. If the answer to the question inputted at the point 542 is "yes", then the program proceeds to the point 548 where the level of the trouble mode is changed to "−1.0". At the point 550, which corresponds to the point 202 of FIG. 10, a graphic process is performed as described in connection with the flow diagram of FIG. 10. Upon completion of this graphic process, the program proceeds to the end point 552 after a combination of steps similar to the steps as described in connection with the points 516 to 526 are repeated a predetermined number of times. This predetermined number is equal to the number of the trouble modes specified for the part D.

The operation of the trouble checking apparatus of the invention will be described further. The trouble checking apparatus of the invention displays a circuit or system to be checked on the display unit 30 in a graphic form. The regions included in the circuit or system is presented in one of different colors indicating the respective trouble mode levels. Therefore, the operator can seize the region at which a trouble may occur with ease.

When the trouble checking operation is started, the regions are presented in yellow to indicate that the regions relate to a defective condition. In the course of the trouble checking operation, it is indicated that the regions presented in yellow may be subject to failure. If the result of the test made for a selected part is "not OK", the operator can seize from the orange presentation that the part is subject to failure with a higher degree of possibility before the cause of the trouble in the part is assured. When the region at which the circuit or system is subject to failure is assured, the region is presented in red. If the region is not subject to failure, it is presented in blue. Therefore, the operator can get the entire picture of the regions related to a selected defective condition. It is also possible the possibility of troubles in the respective: regions at every times in the course of the trouble checking operation. This is effective to narrow the cause of the defective condition down while removing the regions not related to the defective condition from the circuit or system to be checked.

Figure 28:
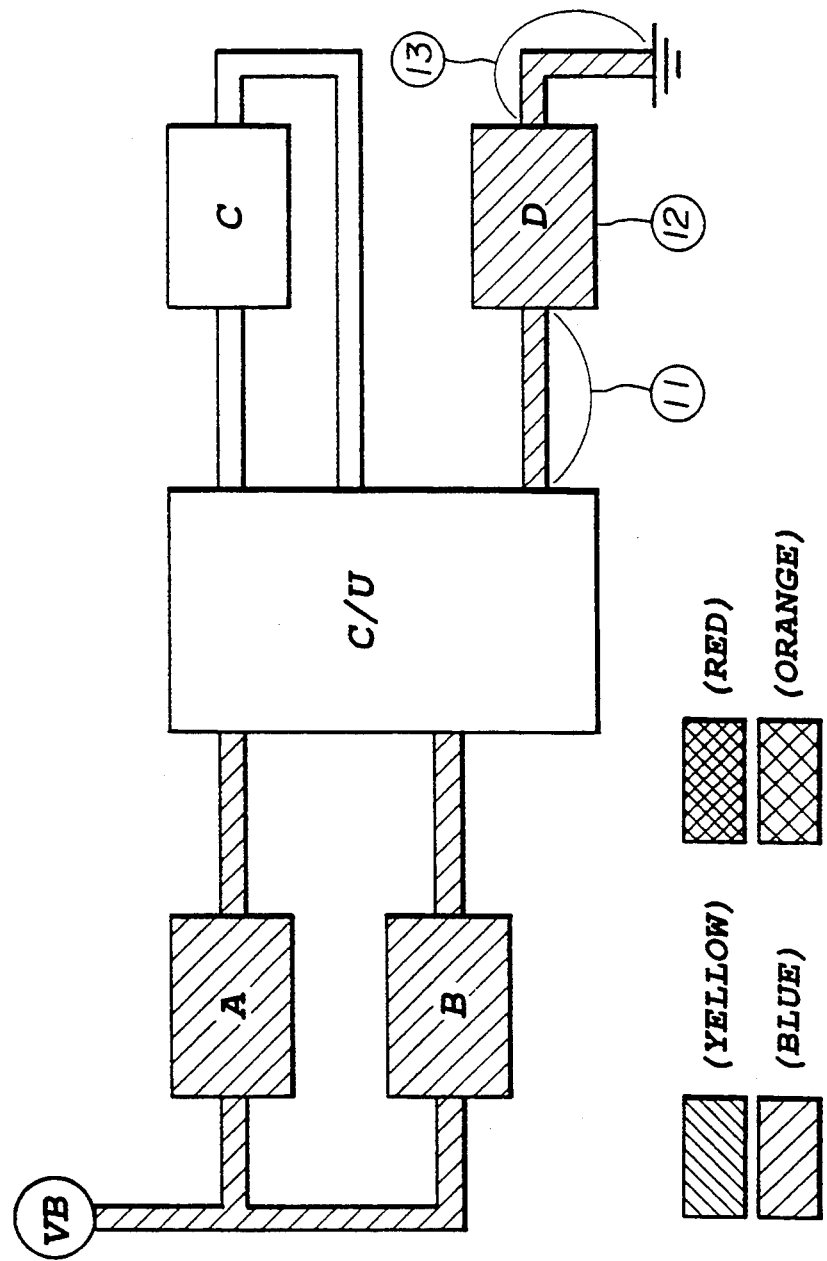
FIG. 28 is a circuit diagram showing the regions presented on the display unit in different colors.
Figure 30:
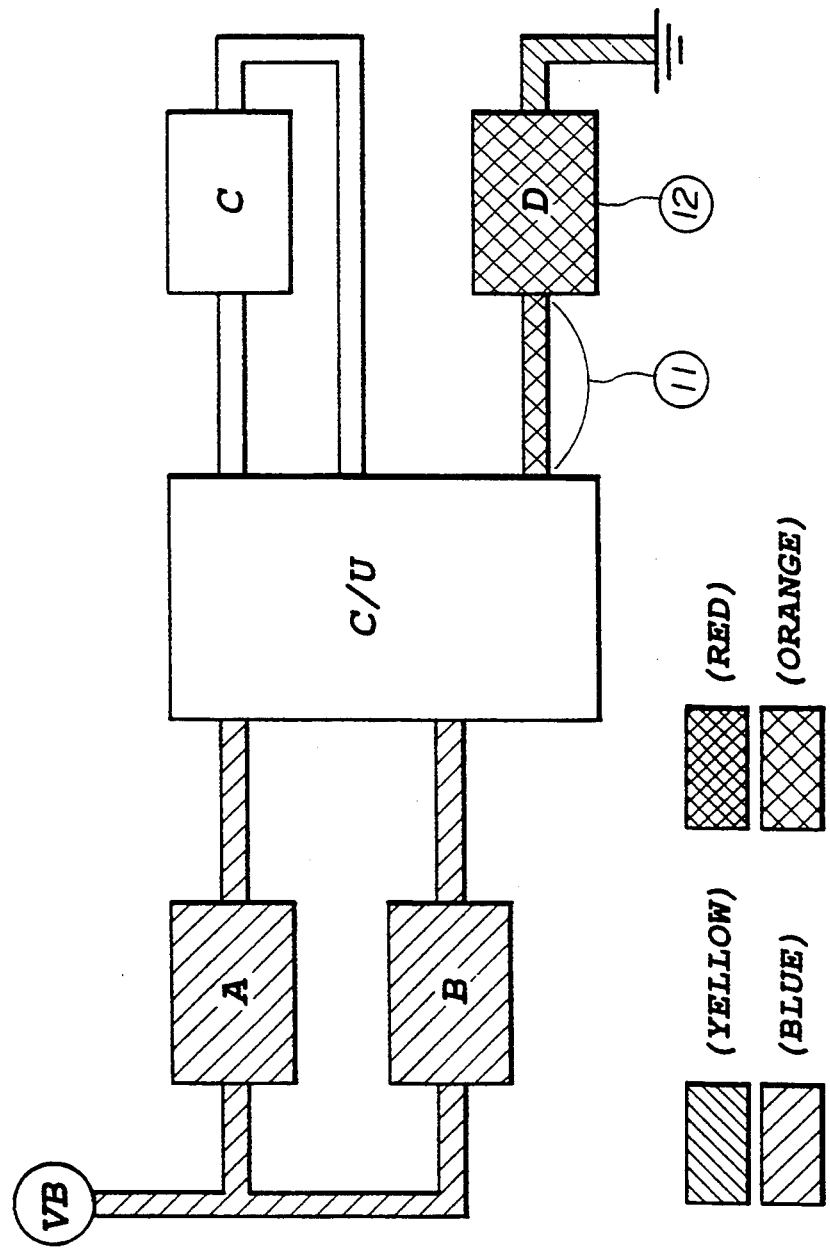
FIG. 30 is a circuit diagram showing the regions presented on the display unit in different colors.
Figure 32:
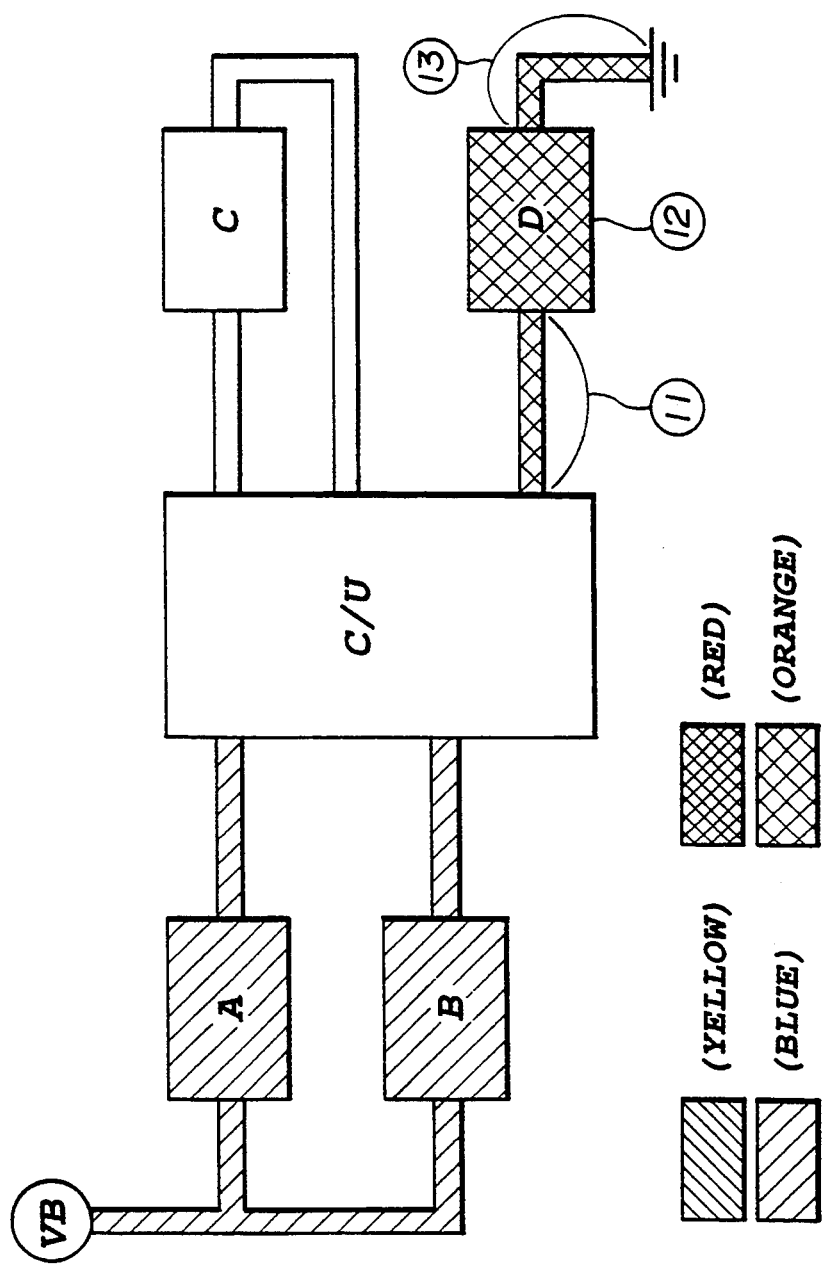
FIG. 32 is a circuit diagram showing the regions presented on the display unit in different colors.

Although the invention has been described in connection with trouble mode level changes achieved as a result of the tests made in a predetermined sequence for respective trouble modes, it is to be noted that the invention is not limited in any way to such a trouble mode level changing manner. Alternatively, the trouble mode level changes may be made in the following manner:

It is now assumed that the specified part D is a sensor. A test is made for the sensor by comparing its output voltage V with first and second reference values V1 and V2. If V1<V<V2, it means that the sensor is in order and the levels of the trouble modes related to the part D are changed to "−1.0", as shown in FIG. 27. In this case, the related region is presented in blue, as shown in FIG. 28. If V-<V1, it means that a short occurs in the sensor and the levels of the trouble modes (trouble modes a—part D and c—part D) related to the part D are changed from "0.0" to "0.5", as shown in FIG. 29. In this case, the related region is presented in orange, as shown in FIG. 30. If V>V2, it means that a disconnection occurs in the sensor and the levels of the trouble modes (trouble modes b—part D, d—part D and e—part D) related to the part D are changed from "0.0" to "0.5", as shown in FIG. 31. In this case, the related region is presented in orange, as shown in FIG. 32.

Figure 33:
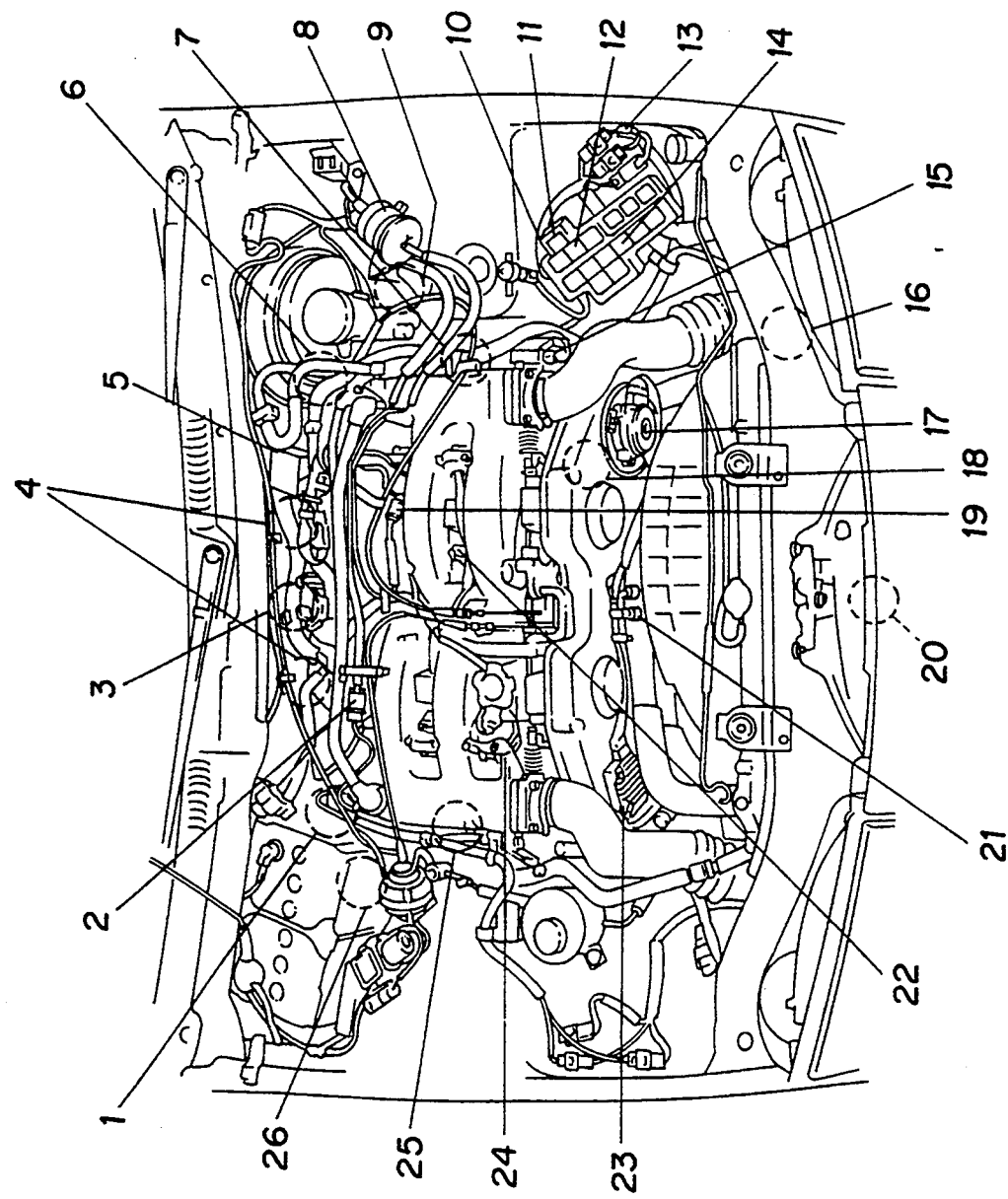
FIG. 33 is a diagram showing the engine room part layout presented on the display unit.
Figure 34:
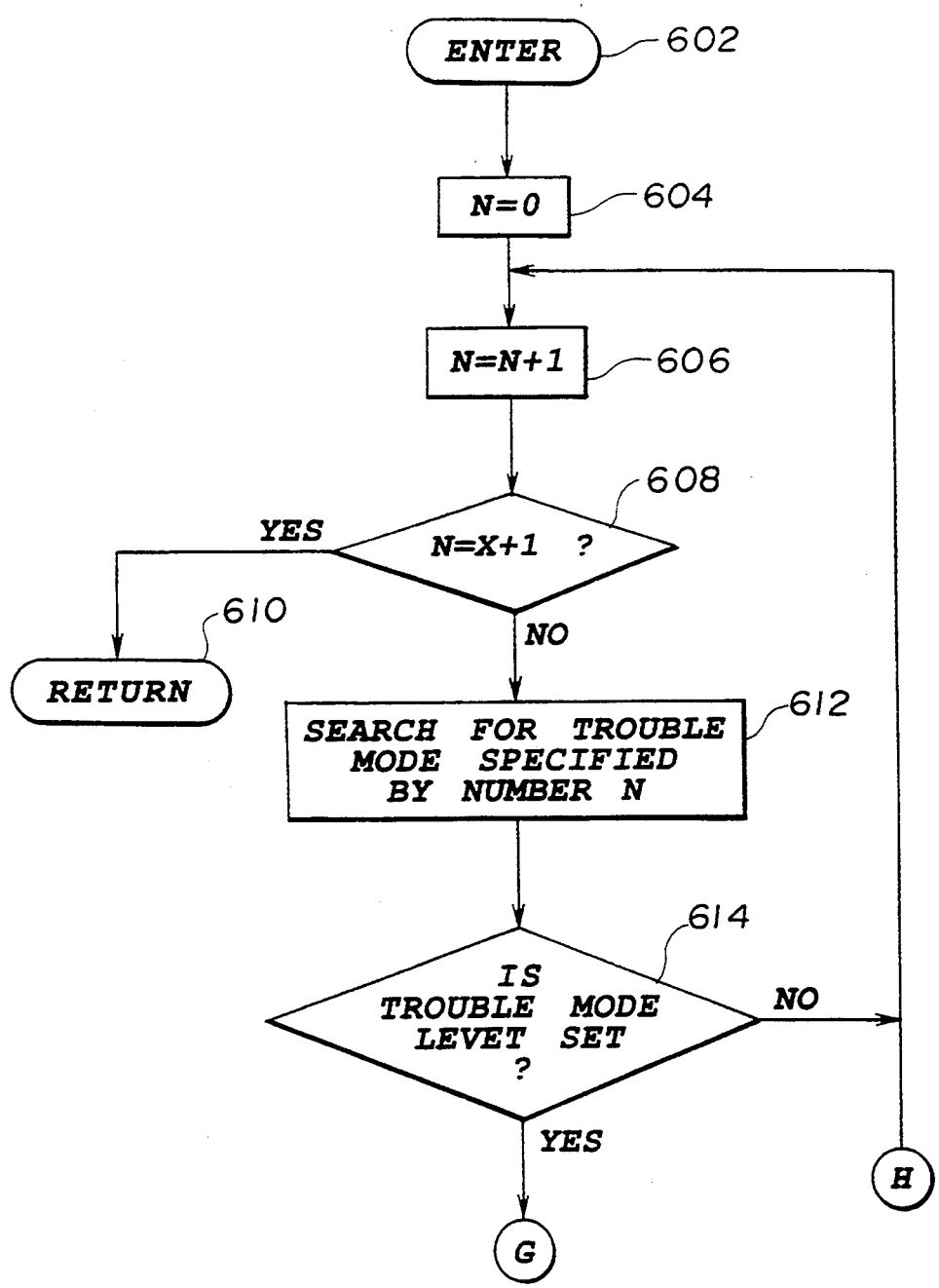
FIGS. 34 and 35 are flow diagrams showing the programming of the digital computer as it is used for the graphic process.
Figure 35:
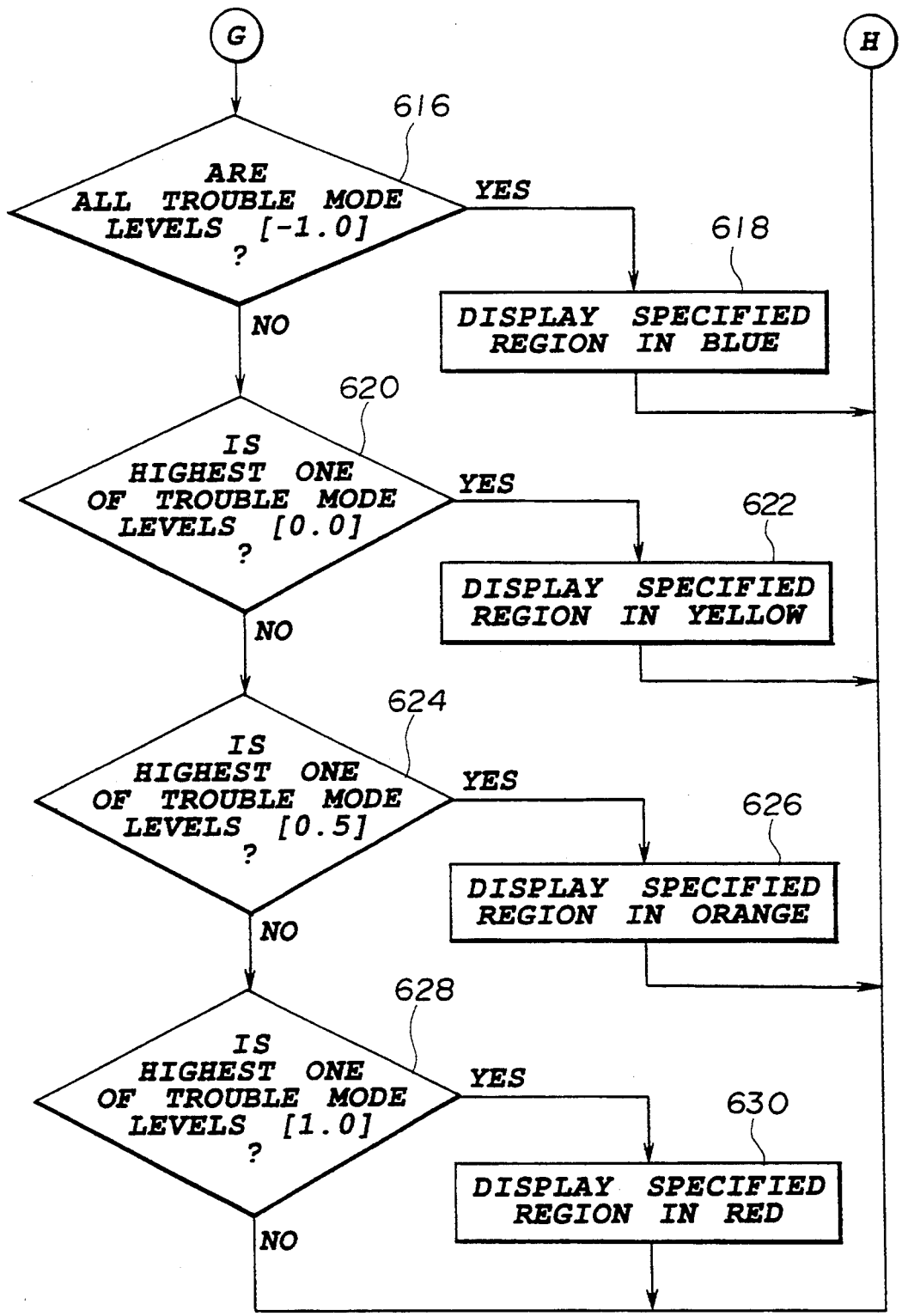

FIG. 33 shows an engine room part layout displayed in a graphic presentation according to a second embodiment of the trouble checking apparatus of the invention. In this embodiment, the parts (1), (2) , (3) . . . (24) are presented in one of different colors according to test results. This embodiment is substantially the same as the first embodiment except for the graphic process. In this embodiment, the graphic process is made according to the program shown in the flow diagrams of FIGS. 34 and 35.

The computer program is entered at the point 602, which corresponds to the point 112 of FIG. 2. At the point 604 in the program, the count N of a region number counter is initialized to zero. The count N indicates the region number. At the point 606 in the program, the count N of the region number counter is incremented by one step. At the point 608 in the program, a determination is made as to whether or not the count N is equal to X+1 where X is the greatest one of the region number IV. If the answer to this question is "yes", then it means that the graphic process for the presented circuit diagram has been completed and the program proceeds to the point 610 where the computer program is returned to the entry point 602. Otherwise, the program proceeds to the point 612 where the central processing unit searches for the trouble modes specified by the region number N. For example, the trouble mode a_part A, the trouble mode b_part A, the trouble mode a_part B, and the trouble mode b_part B are searched when the region number N is "1".

At the point 614 in the program, a determination is made as to whether or not the trouble mode level has been set for the region number N. If the answer to this question is "no", then the program is returned to the point 606. Otherwise, the program proceeds to the point 616. For example, since all of the levels of the trouble modes specified by the region number "1", that is, the trouble mode a_part A, the trouble mode b_part A, the trouble mode a_part B, and the trouble mode b_part B, have been set at [0.0], the program proceeds to the point 616. Since the trouble modes specified by the region number "8", that is, the trouble mode a_part C and the trouble mode b_part C, are not related to the inputted defective condition and the trouble mode levels therefor have not been set, however, the program proceeds to the point 606.

At the point 616 in the program, a determination is made as to whether or not all of the trouble mode levels for the region number N are [−1.0]. If the answer to this question is "yes", then it means that the part is in order and the program proceeds to the point 618 where the region specified by the region number N is presented in blue. Following this, the program is returned to the point 606. Otherwise, the program proceeds from the point 616 to the point 620. It is now assumed that the region number is "2". If all of the levels of the trouble mode a_part A and the trouble mode b_part A are [−1.0], then it means that this region is in order and the program proceeds to the point 224. If either of the trouble mode a_part A and the trouble mode b_part is not [−1.0], then it means that a trouble may occur in the region.

At the point 620 in the program, a determination is made as to whether or not the highest one of the trouble mode levels for the region specified by the region number N is [0.0.7]. If the answer to this question is "yes", then i t is considered that the possibility exists that a trouble occurs in this region and the program proceeds to the point 622 where the region specified by the region number N is presented in yellow. In this case, the existing trouble mode levels are [0.0] or a combination of [−1.0] and [0.0]. Following this, the program is returned to the point 606. Otherwise, i t means the existing trouble mode level is higher than the level [0.0] and the program proceeds from the point 620 to the point 624. At the point 624 in the program, a determination is made as to whether or not the highest one of the trouble mode levels is [0.5]. If the answer to this question is "yes", then it means a higher degree of the possibility of a trouble in this region and the program proceeds to the point 626 where the region specified by the region number N is presented in orange. In this case, the existing trouble mode levels are [0.5] or a combination of [0.5], [0.0] and [−1.0]. Following this, the program is returned to the point 606. Otherwise, the program proceeds from the point 624 to the point 628. At the point 628 in the program, a determination is made as to whether or not the highest one of the trouble mode levels is [1.0]. If the answer to this question is "yes", then it means a trouble occurs in this region and the program proceeds to the point 630 where the region specified by the region number is presented in red. In this case, the existing trouble mode levels are [1.0] or a combination of [1.0], [0.5], [0.0] and [− 1.0]. Following this, the program is returned to the point 606. Otherwise, the program is returned from the point 628 to the point 606.

Figure 36:
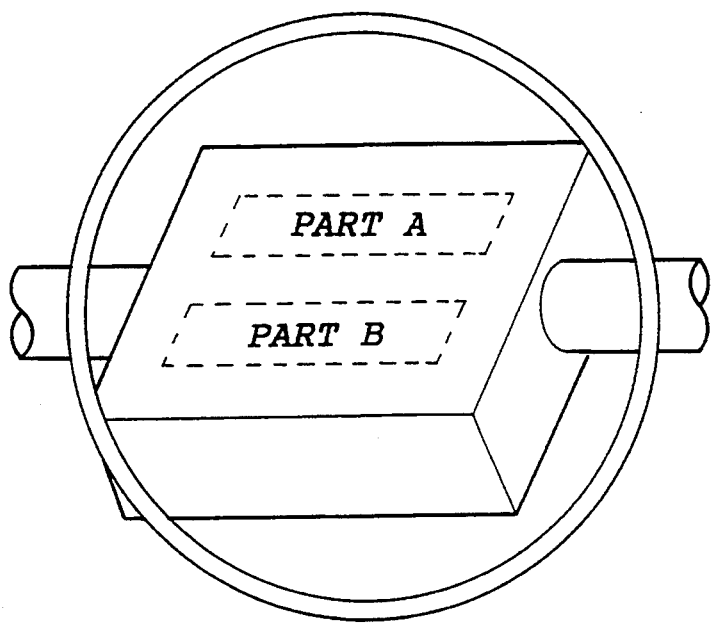
FIG. 36 is an enlarged perspective view used in explaining the parts integrated as a unit.
Figure 39:
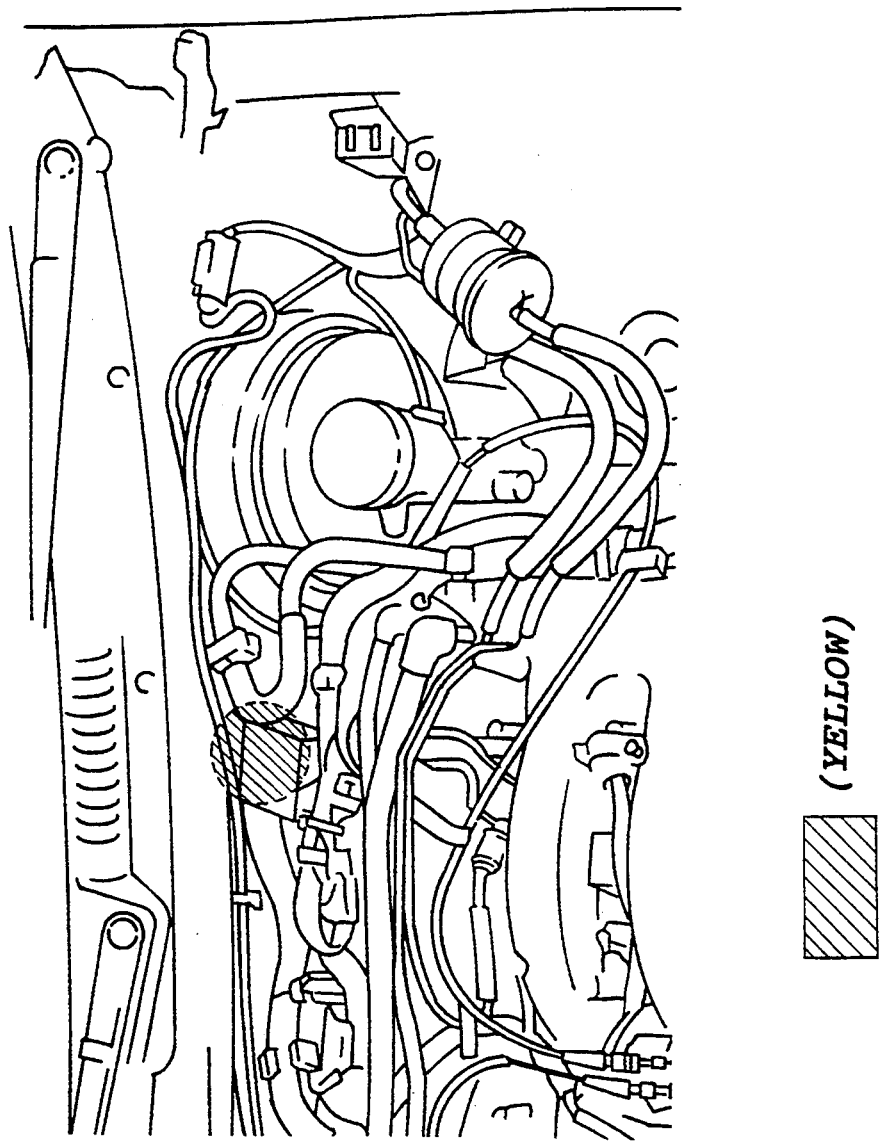
FIG. 39 is a diagram showing a region presented on the display unit in a specified color.
Figure 41:
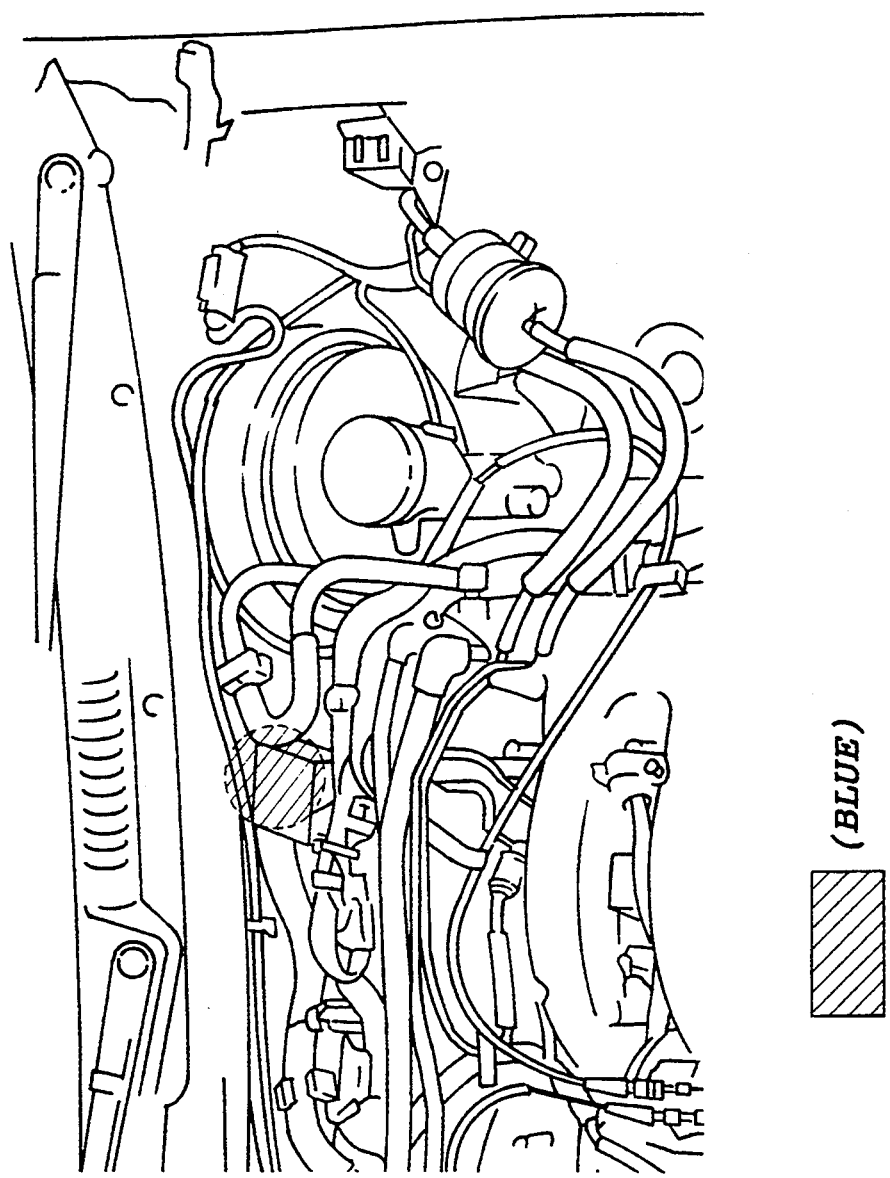
FIG. 41 is a diagram showing a region presented on the display unit in a specified color.

The operation of the trouble checking apparatus of the second embodiment will be described further. It is now assumed that the trouble modes related to the part A and the trouble modes related to the part B correspond to a region specified by the region number "5", as shown in FIGS. 36 and 37. If the result of the test made for the part A at the point 304 of FIG. 12 is "OK", the trouble mode level will be changed from "0.0" to "−1.0", as shown in FIG. 38. Since no test has been made for the part B in this region, however, the levels of the trouble modes related to the part B remain at "0.0" so that the region specified by the region number "5" is presented in yellow, as shown in FIG. 39. If the result of the test made for the part B at the point 404 of FIG. 15 is "OK", the trouble mode level will be changed from "0.0" to "−1.0", as shown in FIG. 40. Since all of the levels of the trouble modes related to the region number "5" are "−1.0", the region is presented in blue, as shown in FIG. 41.

Figure 42:
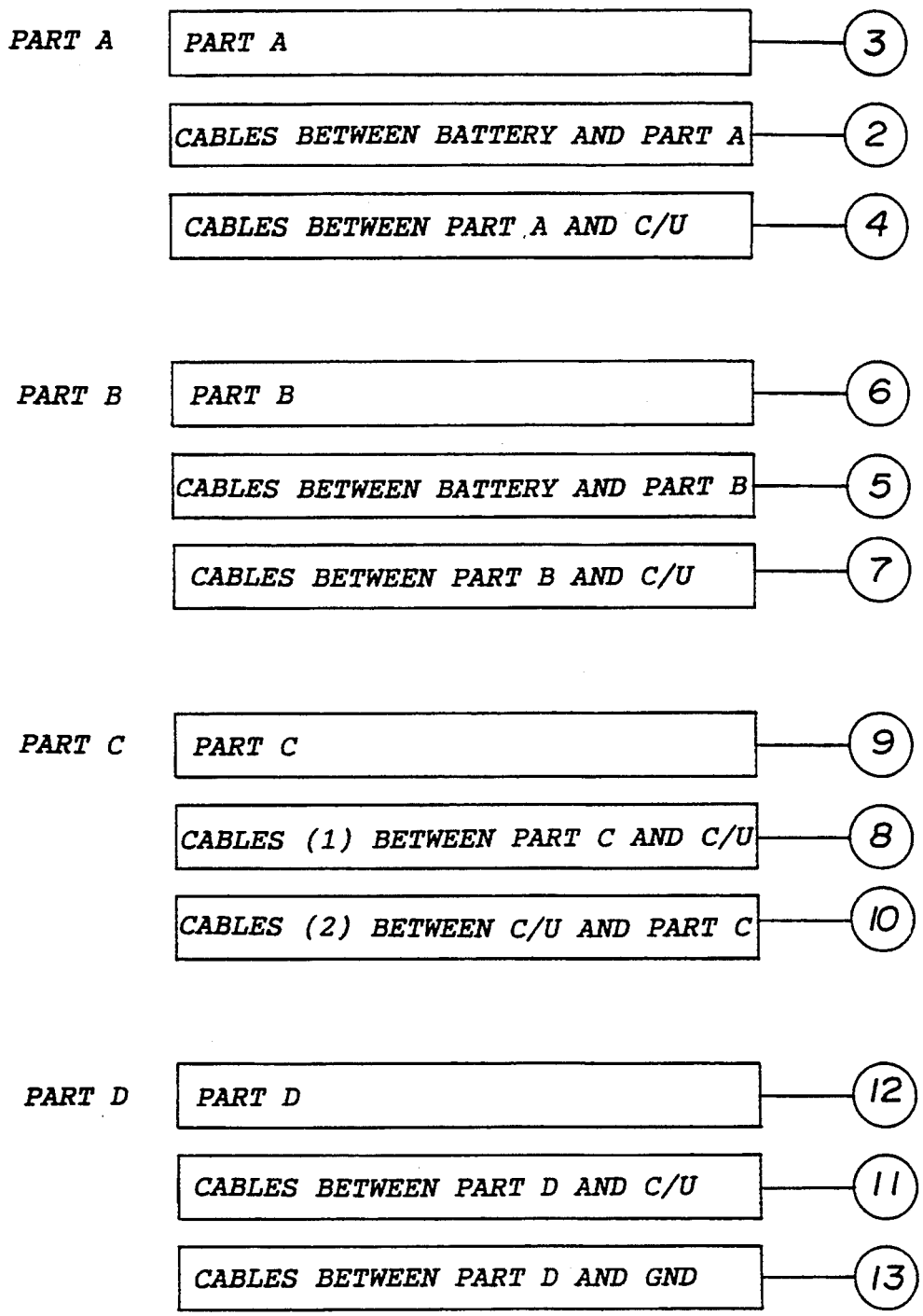
FIG. 42 is a diagram used in explaining a manner in which the checked regions are presented on the display unit.

In the second embodiment, a part layout is presented on the display unit 30 as viewed in the actual product. The region related to a defective condition is presented in one of colors which indicate respective trouble mode levels corresponding to the degrees of the possibility of the trouble in the region. It is, therefore, possible for the operator to access the defective part with ease. Since the region cannot be presented in blue until tests for all of the parts related to the region are completed, there is no omission. Characters may be presented singly or in combination with the circuit diagram and/or the part layout. For example, the regions included in the circuit diagram of FIG. 7 may be indicated by characters, as shown in FIG. 42. Alternatively, the results of FIG. 26 may be presented as shown in FIG. 43. The color presentations may be replaced with various kinds of oblique line presentations or shade presentations.

What is claimed is:

1. A trouble checking apparatus for checking a trouble in a system, comprising:
   input means for inputting data related to operating conditions of the system to be checked;
   checking means for checking a defective condition for each of different regions of the system to detect and identify for each of said regions a respective one of a plurality of levels, each of said plurality of levels respectively corresponding to a predetermined degree of likelihood of the trouble causing the defective condition based upon the inputted data;
   display means for providing a graphic presentation of the system; and
   control means for controlling the display means to display each of the regions in one representation of a plurality of different representations respectively corresponding to said plurality of levels, said one representation corresponding to the detected one of said plurality of levels respectively identified with said each of the regions.

2. The trouble checking apparatus as claimed in claim 1, wherein the display means includes means for presenting a circuit diagram for the system.

3. The trouble checking apparatus as claimed in claim 1, wherein the display means includes means for presenting a part layout for the system.

4. The trouble checking apparatus as claimed in claim 1, wherein the control means includes means for representing each of the regions in one of a plurality of different colors corresponding to the respective one of the plurality of levels detected and identified therewith.

5. The trouble checking apparatus as claimed in claim 1, wherein the control means includes means for representing each of the regions in one of a plurality of different oblique line presentations corresponding to the respective one of the plurality of levels detected and identified therewith.

6. The trouble checking apparatus as claimed in claim 1, wherein the control means includes means for representing each of the regions in one of a plurality of different shade presentations corresponding to the respective one of the plurality of levels detected and identified therewith.

7. The trouble checking apparatus as claimed in claim 1, wherein the control means includes means for representing each of the regions with characters corresponding to the respective one of the plurality of levels detected and identified therewith.

8. A trouble checking apparatus for checking a trouble in a system, comprising:
input means for inputting data related to operating conditions of the system to be checked;
checking means for checking a defective condition for each of different regions of the system to provide a result based upon the inputted data;
display means for providing a graphic presentation of the system; and
control means for providing different representations for each of the regions of the presented system based upon the result, wherein the control means includes means for providing different presentations for each of the regions of the system according to a plurality of levels each corresponding to a degree of possibility of the trouble causing the defective condition at the system.

* * * * *